(12) United States Patent
Montalvo et al.

(10) Patent No.: US 9,577,689 B2
(45) Date of Patent: Feb. 21, 2017

(54) APPARATUS AND METHODS FOR WIDE BANDWIDTH ANALOG-TO-DIGITAL CONVERSION OF QUADRATURE RECEIVE SIGNALS

(71) Applicant: Analog Devices, Inc., Norwood, MA (US)

(72) Inventors: Antonio Montalvo, Raleigh, NC (US); Richard P. Schubert, Medfield, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 19 days.

(21) Appl. No.: 14/183,144

(22) Filed: Feb. 18, 2014

(65) Prior Publication Data
US 2015/0236739 A1 Aug. 20, 2015

(51) Int. Cl.
| | | |
|---|---|---|
| *H04B 1/10* | (2006.01) | |
| *H04B 1/30* | (2006.01) | |
| *H04B 1/12* | (2006.01) | |
| *H03M 1/06* | (2006.01) | |
| *H03M 1/12* | (2006.01) | |

(Continued)

(52) U.S. Cl.
CPC .......... *H04B 1/123* (2013.01); *H03M 1/0626* (2013.01); *H03M 1/121* (2013.01); *H04L 27/14* (2013.01); *H04L 27/3863* (2013.01); *H04L 27/00* (2013.01)

(58) Field of Classification Search
CPC ... H04B 1/10; H04B 1/16; H04B 1/30; H04B 1/123; H03M 1/0626; H03M 1/121; H04L 27/14; H04L 27/3863; H04L 27/00
USPC ....... 455/296, 302, 303, 304, 305, 306, 307, 455/323, 324; 375/346, 349, 350
See application file for complete search history.

(56) References Cited

U.S. PATENT DOCUMENTS

| | | |
|---|---|---|
| 5,705,949 A | 1/1998 | Alelyunas et al. |
| 7,894,555 B2 | 2/2011 | Lindoff et al. |

(Continued)

FOREIGN PATENT DOCUMENTS

| | | |
|---|---|---|
| KR | 2004-0058420 A | 7/2007 |

OTHER PUBLICATIONS

P. Aziz, H. Sorensen, J. Van der Spiegel, "Multiband sigma-delta modulation," Electronics Letters, Apr. 1993, 5 pages.

(Continued)

*Primary Examiner* — Nguyen Vo
(74) *Attorney, Agent, or Firm* — Knobbe Martens Olson & Bear LLP

(57) ABSTRACT

Apparatus and methods for analog-to-digital conversion of quadrature receive signals are provided herein. In certain implementations, a transceiver system includes at least a first pair of analog-to-digital converters (ADCs) associated with a first quadrature receiver channel and a second pair of ADCs associated with a second quadrature receiver channel. The first and second pairs of ADCs can provide analog-to-digital conversion of the same receive signal, but can have different noise profiles relative to one another, such as a low pass noise profile and a band pass noise profile. The transceiver system can further include a reconstruction filter for combining the outputs of at least the first and second pairs of ADCs to generate output signals associated with a lower overall noise profile relative to that of either pair of ADCs alone.

35 Claims, 15 Drawing Sheets

(51) Int. Cl.
*H04L 27/14* (2006.01)
*H04L 27/38* (2006.01)
*H04L 27/00* (2006.01)

(56) References Cited

U.S. PATENT DOCUMENTS

| | | | |
|---|---|---|---|
| 8,036,317 B2 | 10/2011 | D'Alessandro | |
| 8,290,450 B2 | 10/2012 | Hammerschmidt et al. | |
| 8,331,506 B2 | 12/2012 | Park et al. | |
| 8,509,298 B2 | 8/2013 | Hormis | |
| 2002/0160741 A1* | 10/2002 | Kim | H03D 3/009 455/318 |
| 2003/0058148 A1 | 3/2003 | Sheen | |
| 2007/0202825 A1* | 8/2007 | Park | H04B 17/21 455/226.1 |
| 2008/0232480 A1* | 9/2008 | Tuttle | H04H 40/18 375/259 |
| 2011/0057834 A1* | 3/2011 | Miller | G01S 19/37 342/357.25 |
| 2012/0127009 A1 | 5/2012 | Pagnanelli | |
| 2012/0206285 A1* | 8/2012 | Khlat | H03M 3/40 341/155 |
| 2013/0243131 A1 | 9/2013 | An et al. | |
| 2014/0270001 A1 | 9/2014 | Schubert et al. | |
| 2014/0270002 A1 | 9/2014 | Schubert et al. | |
| 2014/0273902 A1 | 9/2014 | An et al. | |

OTHER PUBLICATIONS

P. Aziz, H. Sorensen, J. Van der Spiegel, "Multiband sigma delta analog to digital conversion," Proceedings, IEEE International Conference on Acoustics, Speech, and Signal Processing, 1994, 4 pages.

European Search Report in Application No. 15154558.9 mailed Jun. 19, 2015 7 pages.

Taiwanese Office Action of Dec. 21, 2015 and English translation thereof for Taiwanese Patent Application No. 104100930, filed on Jan. 12, 2015, in 13 pages.

Korean Office Action dated May 2, 2016 and English Translation thereof for Korean Patent Application No. 10-2015-0010715 filed on Jan. 22, 2015, in 10 pages.

Taiwanese Office Action dated Aug. 25, 2016 and English Translation thereof for Taiwanese Patent Application No. 104100930 filed on Jan. 12, 2015, in 10 pages.

Korean Notice of Allowance dated Oct. 21, 2016 and English Translation thereof for Korean Patent Application No. 10-2015-0010715 filed on Jan. 22, 2015, in 3 pages.

* cited by examiner

APPARATUS AND METHODS FOR WIDE BANDWIDTH ANALOG-TO-DIGITAL CONVERSION OF QUADRATURE RECEIVE SIGNALS

BACKGROUND

Field

Embodiments of the invention relate to electronic systems, and more particularly, to analog-to-digital conversion in transceiver systems.

Description of the Related Technology

Certain electronic systems, such as receiver or transceiver systems, can include analog-to-digital converters (ADCs) for converting analog quadrature receive signals into digital data. For example, the electronic system can include a demodulator for demodulating a signal received from a transmitter to generate in-phase (I) and quadrature-phase (Q) receive signals. Additionally, the ADCs can be used to convert the I and Q receive signals into digital data, which can be further processed by digital processing circuitry.

There is a need for improved analog-to-digital conversion schemes in electronic systems, including, for example, wide bandwidth analog-to-digital conversion of quadrature receive signals in transceiver systems.

SUMMARY

In one aspect, an apparatus includes a plurality of quadrature receiver channels including a first quadrature receiver channel and a second quadrature receiver channel. The first quadrature receiver channel is configured to receive an analog receive signal, and includes a first analog-to-digital converter (ADC) configured to generate a first digital I signal and a second ADC configured to generate a first digital Q signal. The second quadrature receiver channel is configured to receive the analog receive signal, and includes a third ADC configured to generate a second digital I signal and a fourth ADC configured to generate a second digital Q signal. The first and second ADCs have a first noise profile versus frequency, and the third and fourth ADCs have a second noise profile versus frequency that is different from the first noise profile. The apparatus further includes a reconstruction filter configured to combine at least the first and second digital I signals to generate an output I signal, and to combine at least the first and second digital Q signals to generate an output Q signal.

In another aspect, an electronically implemented method of analog-to-digital conversion of quadrature receive signals is provided. The method includes receiving an analog receive signal at a first quadrature receiver channel, generating a first digital I signal using a first analog-to-digital converter (ADC) of the first quadrature receiver channel, generating a first digital Q signal using a second ADC of the first quadrature receiver channel, receiving the analog receive signal at a second quadrature receiver channel, generating a second digital I signal using a third ADC of the second quadrature receiver channel, and generating a second digital Q signal using a fourth ADC of the second quadrature receiver channel. The first and second ADCs have a first noise profile versus frequency, and the third and fourth ADCs have a second noise profile versus frequency that is different than the first noise profile. The method further includes combining two or more digital I signals to generate an output I signal using a reconstruction filter, and combining two or more digital Q signals to generate an output Q signal using the reconstruction filter. The two or more digital I signals include the first and second digital I signals, and the two or more digital Q signals include the first and second digital Q signals.

In another aspect, a transceiver system is provided. The transceiver system includes a first quadrature receiver channel configured to receive an analog receive signal, the first quadrature receiver channel including a first analog-to-digital converter (ADC) configured to generate a first digital I signal and a second ADC configured to generate a first digital Q signal. The transceiver system further includes a second quadrature receiver channel configured to receive the analog receive signal, the second quadrature receiver channel including a third ADC configured to generate a second digital I signal and a fourth ADC configured to generate a second digital Q signal. The first and second ADCs have a first noise profile versus frequency, and the third and fourth ADCs have a second noise profile versus frequency that is different from the first noise profile. The transceiver system further includes a digital processing circuit including a reconstruction filter configured to generate an output I signal by combining at least the first and second digital I signals, and to generate an output Q signal by combining at least the first and second digital Q signals.

DETAILED DESCRIPTION OF EMBODIMENTS

Figure 1A:
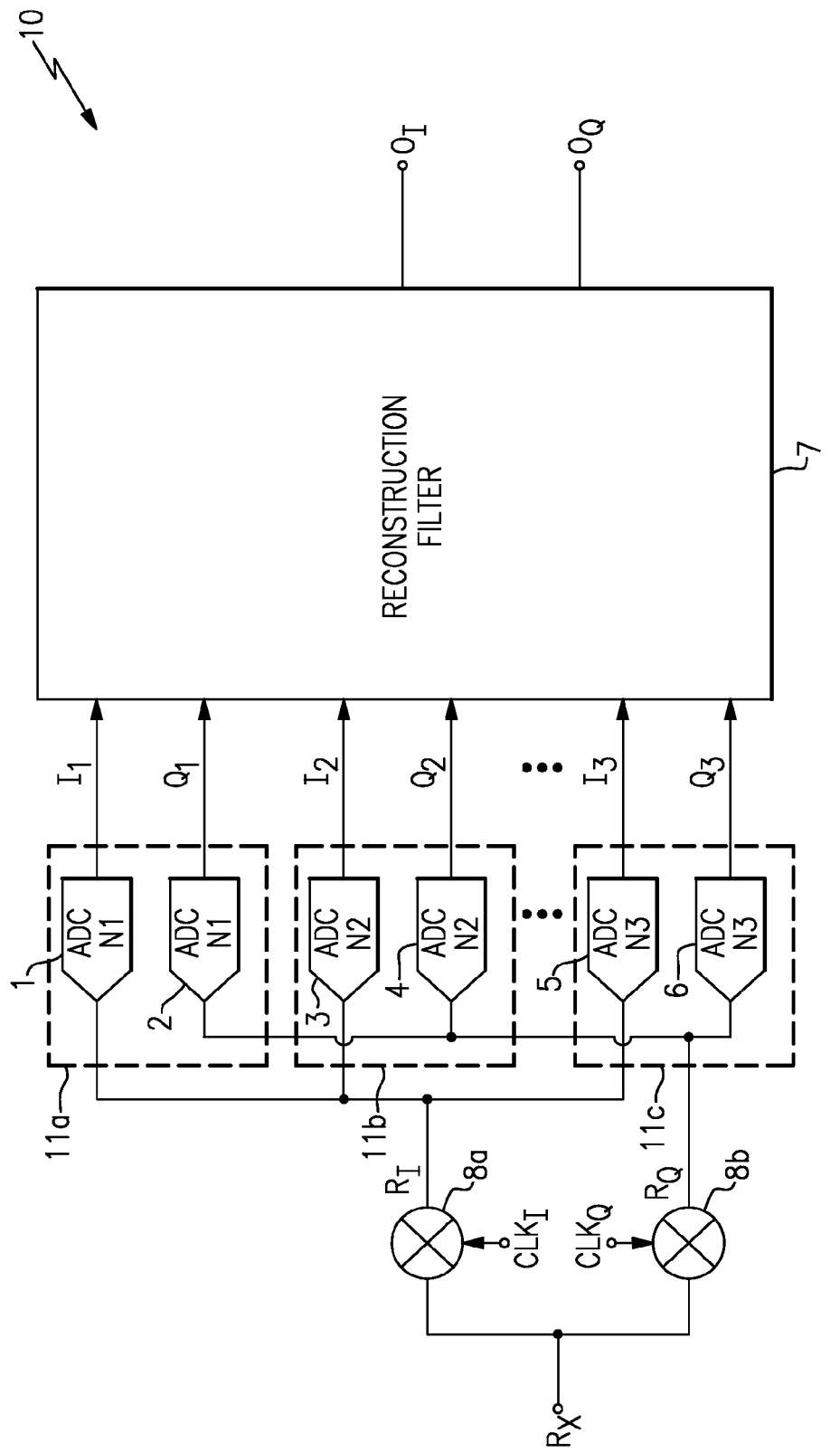
FIG. 1A is a schematic block diagram of an electronic system according to one embodiment.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Overview of Reconstruction Filters

Apparatus and methods for wide bandwidth analog-to-digital conversion of quadrature receive signals are provided herein. In certain implementations, a transceiver system includes at least a first pair of analog-to-digital converters (ADCs) associated with a first quadrature receiver channel and a second pair of ADCs associated with a second quadrature receiver channel. As used herein, a quadrature receiver channel can refer to receiver circuitry used to process a receive signal in all or part to generate a digital in-phase (I) signal and a digital quadrature-phase (Q) signal. The first and second quadrature receiver channels can be used for processing the same receive signal, but the first and second pairs of ADCs can have different noise versus frequency profiles relative to one another. For instance, in one example the first pair of ADCs can be in a low pass configuration and have low noise in a first or low frequency range, and the second pair of ADCs can be in a band pass configuration and have low noise in a second or high frequency range. The transceiver system can further include a reconstruction filter for combining the outputs of at least the first and second pairs of ADCs to generate output signals associated with a lower overall noise profile relative to that of either pair of ADCs alone.

FIG. 1A is a schematic block diagram of an electronic system 10 according to one embodiment. The electronic system 10 includes a first quadrature receiver channel 11a, a second quadrature receiver channel 11b, a third quadrature receiver channel 11c, a reconstruction filter 7, a first mixer 8a, and a second mixer 8b. The first quadrature receiver channel 11a includes a first ADC 1 and a second ADC 2. Additionally, the second quadrature receiver channel 11b includes a third ADC 3 and a fourth ADC 4. Furthermore, the third quadrature receiver channel 11c includes a fifth ADC 5 and a sixth ADC 6. The electronic system 10 receives a receive signal RX, which can be, for example, a radio frequency (RF) or intermediate frequency (IF) signal. Additionally, the electronic system 10 generates an in-phase (I) output signal $O_I$ and a quadrature-phase (Q) output signal $O_Q$.

Although the electronic system 10 is illustrated as including three quadrature receiver channels, the electronic system 10 can include more or fewer quadrature receiver channels. For example, the teachings herein are applicable to configurations including two quadrature receiver channels, three quadrature receiver channels, or four or more quadrature receiver channels.

The electronic system 10 can correspond to a portion of a transceiver or receiver system. Accordingly, the electronic system 10 can include additional components and circuitry which have been omitted from FIG. 1A for clarity.

The first mixer 8a receives the receive signal RX and an I clock signal $CLK_I$, and generates an I receive signal $R_I$. The second mixer 8b receives the receive signal RX and a Q clock signal $CLK_Q$, and generates a Q receive signal $R_Q$.

Accordingly, the I and Q receive signals $R_I$, $R_Q$ can correspond to analog quadrature receive signals generated by a receiver using demodulation. In certain implementations, the I and Q receive signals $R_I$, $R_Q$ can be generated by demodulation using quadrature clock signals having substantially the same period, and a phase difference that is about one-quarter of the period or about 90°. For instance, in one example, the I clock signal $CLK_I$ can be a sine clock signal and the Q clock signal $CLK_Q$ can be a cosine clock signal.

In the illustrated configuration, the first ADC 1 receives the I receive signal $R_I$ and generates a first digital I signal $I_1$, and the second ADC 2 receives the Q receive signal $R_Q$ and generates a first digital Q signal $Q_1$. Additionally, the third ADC 3 receives the I receive signal $R_I$ and generates a second digital I signal $I_2$, and the fourth ADC 4 receives the Q receive signal $R_Q$ and generates a second digital Q signal $Q_2$. Furthermore, the fifth ADC 5 receives the I receive signal $R_I$ and generates a third digital I signal $I_3$, and the sixth ADC 6 receives the Q receive signal $R_Q$ and generates a third digital Q signal $Q_3$. The reconstruction filter 7 receives the first to third digital I signals $I_1$-$I_3$ and the first to third digital Q signals $Q_1$-$Q_3$, and generates I and Q output signals $O_I$, $O_Q$.

The ADCs of a particular quadrature receiver channel can have substantially the same noise profile versus frequency. For example, the first and second ADCs 1, 2 can have a similar noise profile N1, the third and fourth ADCs 3, 4 can have a similar noise profile N2, and the fifth and sixth ADCs 5, 6 can have a similar noise profile N3. However, the ADCs of different quadrature receiver channels can have different noise profiles relative to one another. For example, the noise profile N1, the noise profile N2, and the noise profile N3 can be different from one another.

The noise profiles of the quadrature receiver channels can be configured such that each quadrature receiver channel has a relatively low noise over a particular range of frequencies, which can be at least partially non-overlapping with respect to the noise profile of other quadrature receiver channels. For example, the first quadrature receiver channel 11a can be configured to have relatively low noise over a first frequency range, the second quadrature receiver channel 11b can be configured to have relatively low noise over a second frequency range, and the third quadrature receiver channel 11c can be configured to have relatively low noise over a third frequency range.

The reconstruction filter 7 can be used to combine the digital output signals generated by the ADCs of the quadrature receiver channels to generate an output signal having a relatively low overall noise. Since the quadrature receiver channels can have different amounts of noise depending on frequency, the reconstruction filter 7 can generate the I and Q output signals $O_I$, $O_Q$ based on selectively combining the outputs of the quadrature receiver channels over different frequency ranges. For example, when a particular quadrature receiver channel has a relatively low noise at a certain frequency relative to the other quadrature receiver channels, the reconstruction filter 7 can generate frequency components of the I and Q output signals $O_I$, $O_Q$ at that frequency based on the outputs of that quadrature receiver channel.

In one embodiment, the reconstruction filter 7 can generate the I output signal $O_I$ based on a weighted sum of the first to third digital I signals I1-I3, and can generate the Q output signal $O_Q$ based on the weighted sum of the first to third digital Q signals Q1-Q3. Additionally, the values of the coefficients of the weighted sum change over frequency, such that when a particular quadrature receiver channel has a relatively low noise at a certain frequency relative to the other quadrature receiver channels, the coefficient of that channel in the weighted sum at that frequency can be greater than that of the coefficients associated with other channels. By configuring a reconstruction filter in this manner, the reconstruction filter can have a noise profile associated with lower overall noise relative to that of any quadrature receiver channel alone.

In certain implementations, the first to sixth ADCs 1-6 can have a similar circuit topology, but can achieve different noise profiles based on digitally configuring the ADCs. For example, in one embodiment, the ADCs are implemented as sigma delta converters, which can have noise profiles that can be controlled based on digitally selecting values of coefficients of the sigma delta converters. For example, sigma delta converters can oversample an input signal, which can provide sufficient bandwidth over which the noise may be shaped across frequency. For instance, an output of a sigma delta based converter can be low pass filtered and down sampled to create a sample stream which has low noise over a selectable bandwidth.

Although noise shaping can reduce noise over one frequency range at the expense of increasing noise over another frequency range, in accordance with the teachings herein, a reconstruction filter can be used to selectively combine the outputs of ADCs associated with different noise versus frequency profiles to achieve overall enhanced noise performance. Although one embodiment has been described above in which the ADCs are implemented using sigma delta converters, the teachings herein are applicable to configurations in which the ADCs are implemented in other ways.

Figure 1B:
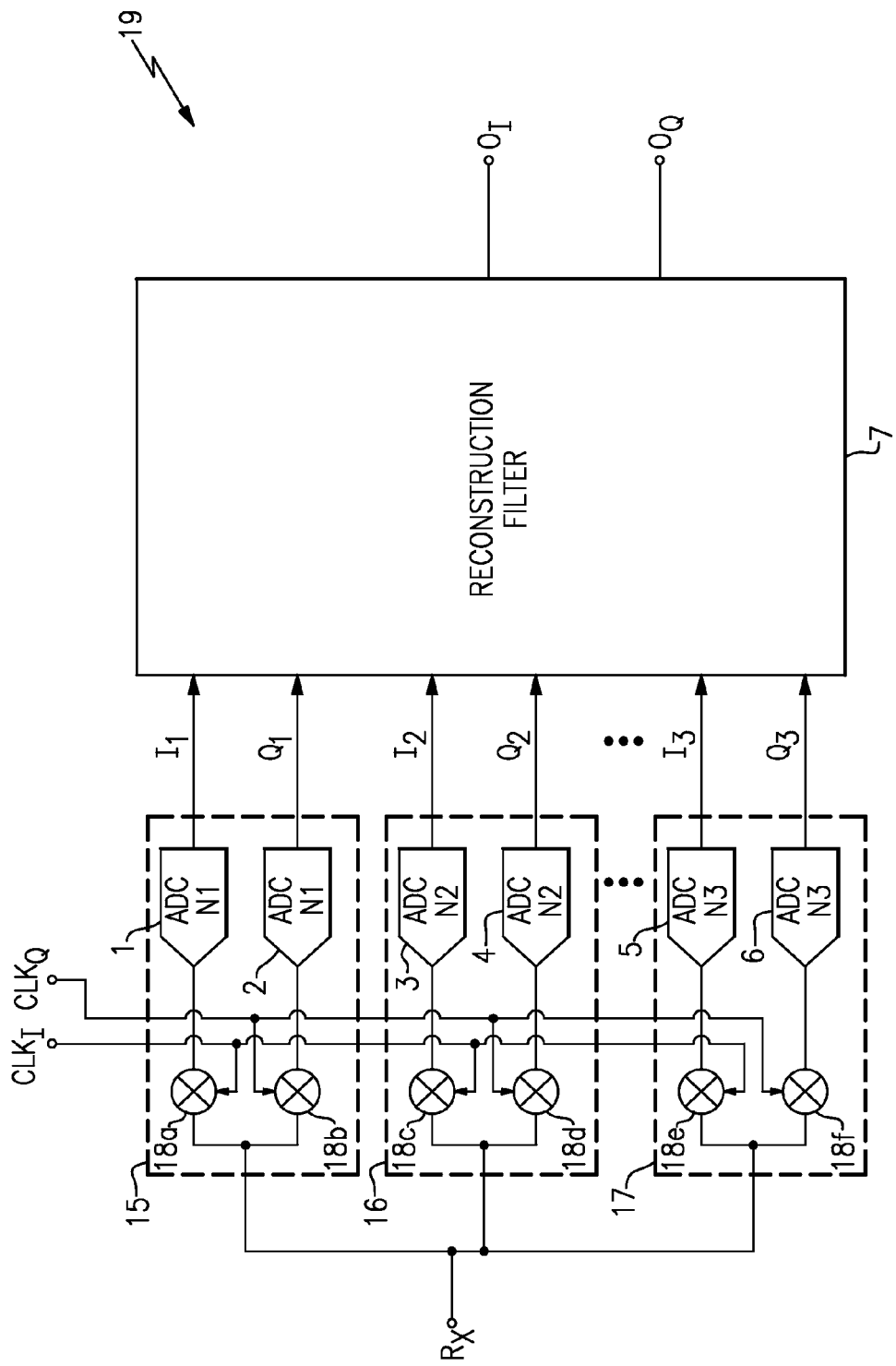
FIG. 1B is a schematic block diagram of an electronic system according to another embodiment.

FIG. 1B is a schematic block diagram of an electronic system 19 according to another embodiment. The electronic system 19 includes a first quadrature receiver channel 15, a second quadrature receiver channel 16, a third quadrature receiver channel 17, and the reconstruction filter 7. The first quadrature receiver channel 15 includes the first and second ADCs 1, 2 and a first pair of mixer 18a, 18b. The second quadrature receiver channel 16 includes the third and fourth ADCs 3, 4 and a second pair of mixers 18c, 18d. The third quadrature receiver channel 17 includes the fifth and sixth ADCs 5, 6 and a third pair of mixers 18e, 18f. The electronic system 19 receives the receive signal RX and generates the I and Q output signals $O_I$, $O_Q$.

The electronic system 19 of FIG. 1B is similar to the electronic system 10 of FIG. 1A, except that the electronic system 19 illustrates a configuration in which separate mixers are used in each quadrature receiver channel. For example, the first pair of mixers 18a, 18b of the first quadrature receiver channel 15 can demodulate the receive signal RX using the I and Q clock signals $CLK_I$ $CLK_Q$ to generate a first I receive signal and a first Q receive signal for the first and second ADCs 1, 2, respectively. Additionally, the second pair of mixers 18c, 18d of the second quadrature receiver channel 16 can demodulate the receive signal RX using the I and Q clock signals $CLK_I$ $CLK_Q$ to generate a second I receive signal and a second Q receive signal for the third and fourth ADCs 3, 4, respectively. Furthermore, the third pair of mixers 18e, 18f of the third quadrature receiver channel 17 can demodulate the receive signal RX using the I and Q clock signals $CLK_I$ $CLK_Q$ to generate a third I receive signal and a third Q receive signal for the fifth and sixth ADCs 5, 6, respectively.

Although FIGS. 1A-1B show two examples of electronic systems that can include a reconstruction filter, reconstruction filters can be used in a wide variety of electronic systems. For example, the teachings herein are applicable to not only to configurations in which pairs of ADCs receive the same I and Q receive signals, but also to configurations in which pairs of ADCs receive different I and Q receive signals generated from a common radio frequency signal. For example, the teachings herein are applicable to configurations in which different pairs of ADCs receive I and Q signals having gain and/or phase mismatch after demodulation and/or configurations in which the receive I and Q signals are generated using separate demodulators. Additionally, the teachings herein are applicable both to direct conversion receives and to receivers that use one or more intermediate frequencies.

Figure 2:
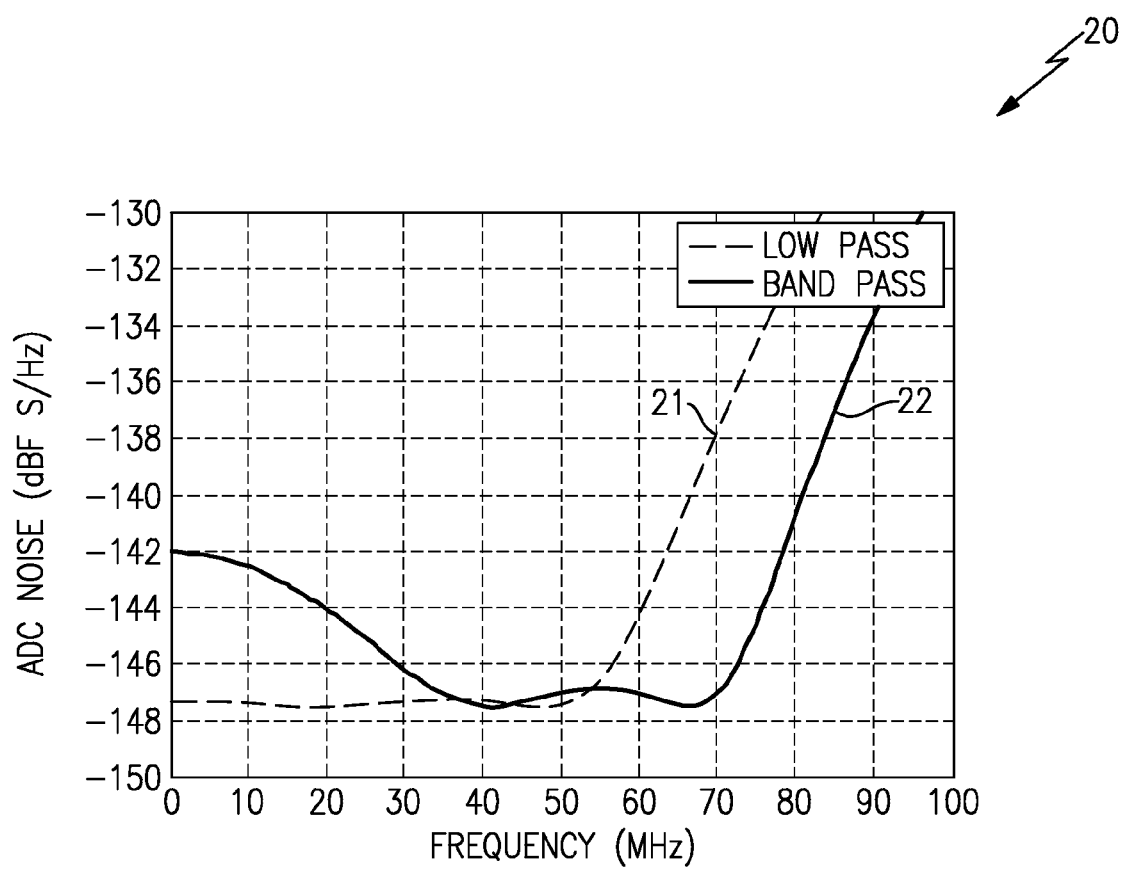
FIG. 2 is a graph of one example of noise versus frequency.

FIG. 2 is a graph 20 of one example of noise versus frequency. The graph 20 includes a first or low pass noise profile 21 of a first pair of ADCs in a low pass configuration. The graph 20 further includes a second or band pass noise profile 22 of a second pair of ADCs in a band pass configuration. Although the graph illustrates a configuration associated with two quadrature receiver channels, the teachings herein are also applicable to configurations using three or more quadrature receiver channels.

As described herein, a reconstruction filter can be used to combine the outputs of ADCs having different noise profiles to generate an output signal having relatively low overall noise. For instance, the reconstruction filter can have an overall noise profile associated with lower noise relative to the noise profile of any individual ADC.

In the illustrated configuration, the low pass noise profile 21 can have a relatively small amount of noise between about 0 MHz and about 50 MHz, and the band pass noise profile 22 can have a relatively small amount of noise between about 35 MHz and about 70 MHz. Thus, in accordance with the teachings herein, a reconstruction filter can be used to combine output signals of the first and second pairs of ADCs to generate an output signal having relatively low noise over a frequency range between about 0 MHz and about 70 MHz. Various embodiments of reconstruction filters suitable for combining outputs of ADCs with different noise profiles will be described in detail herein.

Figure 3A:
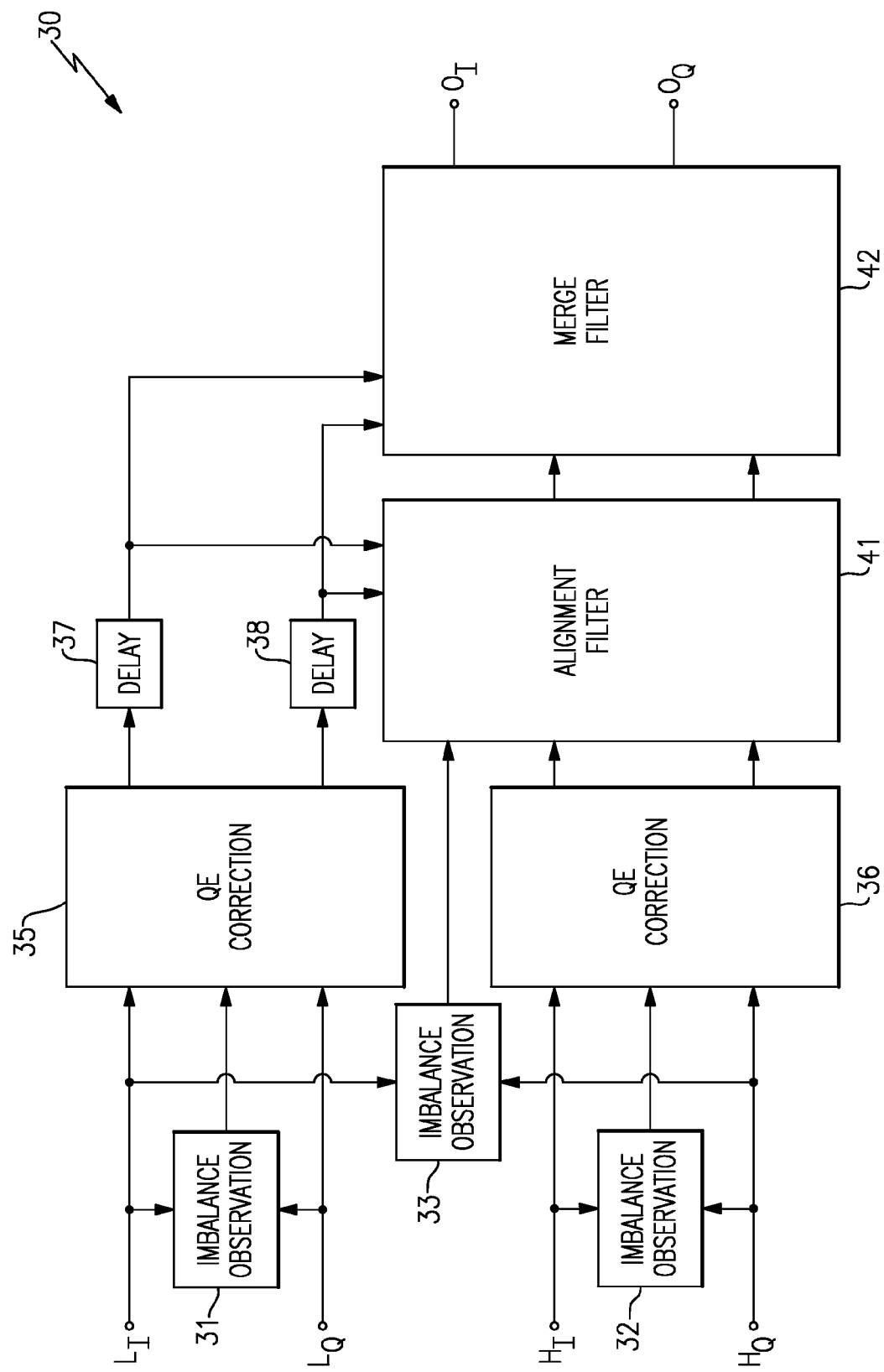
FIG. 3A is a schematic block diagram of one embodiment of a reconstruction filter.

FIG. 3A is a schematic block diagram of one embodiment of a reconstruction filter 30. The reconstruction filter 30 includes a first channel imbalance observation block 31, a second channel imbalance observation block 32, a channel-to-channel imbalance observation block 33, a first quadrature error (QE) correction block 35, a second QE correction block 36, a first delay block 37, a second delay block 38, an alignment filter 41, and a merge filter 42. The various functional blocks described herein can be implemented by hardware and/or software/firmware. Examples of hardware include analog circuits, digital circuits, and the like. These circuits can be implemented in an integrated circuit. When software/firmware is applicable, instructions for software/firmware can be stored in a computer readable memory and executed by a processor. The reconstruction filter 30 receives an I low frequency compensated receive signal $L_I$, a Q low frequency compensated receive signal $L_Q$, an I high frequency compensated receive signal $H_I$, and a Q high frequency compensated receive signal $H_Q$. Additionally, the reconstruction filter 30 generates an I output signal $O_I$ and a Q output signal $O_Q$.

The I and Q low frequency compensated receive signals $L_I$, $L_Q$ can be generated from a first quadrature receiver channel including a first pair of ADCs having low noise power over a first or low frequency range, while the I and Q high frequency compensated receive signals $H_I$, $H_Q$ can be generated from a second quadrature receiver channel including a second pair of ADCs that have low noise power over a second or high frequency range. For example, in certain implementations, the first pair of ADCs can contribute low noise power at low frequencies, whereas the second pair of ADCs can contribute low noise power at high frequencies, or at least a region of high frequency. For example, in one embodiment, the first pair of ADCs can have a low pass noise profile and the second pair of ADCs can have a band pass noise profile. Although the I and Q low frequency compensated receive signals $L_I$, $L_Q$ can have low noise at low frequencies and the I and Q high frequency compensated receive signals $H_I$, $H_Q$ can have low noise at high frequencies, these designations can refer to differing bandwidths of superior signal to noise ratio (SNR), and not necessarily to the bandwidth over which a receive signal is captured.

As shown in FIG. 3A, the first channel imbalance observation block 31 receives the I and Q low frequency compensated receive signals $L_I$, $L_Q$ and generates a first imbalance observation signal. Additionally, the second channel imbalance observation block 32 receives the I and Q high frequency compensated receive signals $H_I$, $H_Q$ and generates a second imbalance observation signal. Furthermore, the channel-to-channel imbalance observation block 33 receives the I low frequency compensated receive signal $L_I$ and the Q high frequency compensated receive signal $H_Q$, and generates a channel-to-channel observation signal. In the illustrated configuration, the first QE correction block 35 receives the I and Q low frequency compensated receive signals $L_I$, $L_Q$ and the first imbalance observation signal, and generates I and Q corrected low frequency compensated signals, which are provided as inputs to the first and second delay blocks 37, 38, respectively. The first and second delay blocks 37, 38 can delay the I and Q corrected low frequency compensated signals to generate I and Q aligned low frequency compensated signals, respectively. The second QE correction block 36 receives the I and Q high frequency compensated receive signals $H_I$, $H_Q$ and the second imbalance observation signal, and generates I and Q corrected high frequency compensated signals, which are provided to the alignment filter 41 as inputs. The alignment filter 41 further receives the channel-to-channel observation signal and the I and Q aligned low frequency compensated signals, and generates I and Q aligned high frequency compensated signals. The merge filter 42 receives the I and Q aligned high frequency compensated signals and the I and Q aligned low frequency compensated signals, and combines or merges them to generate the I and Q output signals $O_I$, $O_Q$.

The illustrated reconstruction filter 30 can be used to combine the outputs of two quadrature receiver channels associated with different noise profiles. For example, the I and Q low frequency compensated receive signals $L_I$, $L_Q$ can be generated by a first quadrature receiver channel having relatively low noise at low frequencies, and the I and Q high frequency compensated receive signals $H_I$, $H_Q$ can be generated by a second quadrature receiver channel having relatively low noise at frequencies higher than that of the first quadrature receiver channel. In one embodiment, the I and Q low frequency compensated receive signals $L_I$, $L_Q$ are generated by a first pair of sigma delta converters in a low pass configuration, and the I and Q high frequency compensated receive signals $H_I$, $H_Q$ are generated by a second pair of sigma delta converters in a band pass configuration. However, the teachings herein are also applicable to other configurations.

The I and Q output signals $O_I$, $O_Q$ generated by the reconstruction filter 30 can have a lower amount of overall noise relative to either the I and Q low frequency compensated receive signals $L_I$, $L_Q$ or the I and Q high frequency compensated receive signals $H_I$, $H_Q$. In certain implementations herein, the noise power of the output signals generated by a reconstruction filter can have a noise power that is less than or equal to about the lesser of the noise power of the input quadrature receiver channels.

The illustrated configuration includes first and second channel imbalance observation blocks 31, 32, which can be used to detect an in-phase/quadrature-phase (IQ) imbalance or quadrature gain and phase error. For example, the first channel imbalance observation block 31 can be used to detect an IQ imbalance between the I and Q low frequency compensated receive signals $L_I$, $L_Q$, and the second channel imbalance observation block 32 can be used to detect an IQ imbalance between the I and Q high frequency compensated receive signals $H_I$, $H_Q$. As shown in FIG. 3A, the first and second channel imbalance observation blocks 31, 32 can generate the first and second imbalance observation signals, respectively, which can indicate quadrature gain and/or phase errors between the input signals relative to signals of about equal magnitude and about a 90 degree phase difference. In certain implementations, the first and second channel imbalance observation blocks 31, 32 are configured to determine whether or not the received I and Q signals are orthogonal, and to generate an observation signal based on the result.

Additionally, the first and second QE correction blocks 35, 36 can receive the first and second imbalance observation signals, respectively, which can be used to correct for the observed IQ imbalance. For example, in certain implementations, the I and Q corrected low frequency compensated signals generated by the first QE correction block 35 can have a substantially orthogonal relationship, and the I and Q compensated high frequency compensated signals generated by the second QE correction block 36 can have a substantially orthogonal relationship. Accordingly, the first QE correction block 35 can be used to remove IQ imbalance associated with the low frequency compensated quadrature receiver channel, and the second QE correction block 36 can be used to remove IQ imbalance associated with the high frequency compensated quadrature receiver channel. In certain embodiments, the first and second imbalance observation signals can be processed by a processor, such as an embedded processor, which can generate control signals for the first and second QE correction blocks 35, 36. Configuring the reconstruction filter in this manner can reduce the QE correction blocks' size and/or complexity.

The channel-to-channel imbalance observation block 33 generates the channel-to-channel observation signal, which in the illustrated configuration can indicate a lack of alignment between the I low frequency compensated receive signal $L_I$ and the Q high frequency compensated receive signal $H_Q$. In one embodiment, the channel-to-channel imbalance observation block 33 can compare the magnitude and phase of the I low frequency compensated receive signal $L_I$ to the magnitude and phase of the Q high frequency compensated receive signal $H_Q$, and can generate the channel-to-channel observation signal based on the result. Although FIG. 3A illustrates a configuration in which a channel-to-channel imbalance observation block observes an I signal from one channel and a Q signal from another channel, other configurations are possible. For example, the teachings herein are applicable to configurations in which a channel-to-channel imbalance observation block observes an I signal of one channel and an I signal of another channel and/or a Q signal of one channel and a Q signal of another channel.

Although FIG. 3A illustrates a configuration using two channel imbalance observation blocks and one channel-to-channel imbalance observation block, other configurations are possible. For example, in certain implementations, imbalance observation blocks can be multiplexed and time shared to provide inter-channel and/or intra-channel observations.

In certain configurations, a channel imbalance observation block can operate in part based on observing a channel's response to a calibration signal. For example, an RF calibration tone can be stepped in frequency and provided as an input to a channel, and the channel's baseband I and Q signal response can be observed to determine an IQ imbalance. As a further example, a communication signal received from a transmitter may be used as a calibration signal. For example, one embodiment of a channel imbalance observation block and a QE correction block can be as described in commonly-owned application Ser. No. 13/764,076, published as U.S. Patent Publication No. 2013/0243131 on Sep. 19, 2013, and titled "REAL-TIME I/Q IMBALANCE CORRECTION FOR WIDE-BAND RF RECEIVER," which is hereby incorporated by reference in its entirety herein. In certain configurations, a channel-to-channel imbalance observation block can operate in part based on comparing responses of two quadrature receiver channels to a calibration signal. For example, an RF calibration tone can be stepped in frequency and provided as an input to both channels, and the first channels' baseband I signal response can be monitored with respect to the second channels' baseband Q signal response to determine imbalance between the channels. In another implementation, unexpected correlation between positive and negative frequencies may be used to determine imbalance between the channels. Although various examples of imbalance observation have been described above, the teachings herein are not limited to the examples provided. Rather, a wide variety of techniques can be used to identify gain and/or phase differences between two signals.

Accordingly, although various examples of an imbalance observation and correction scheme using calibration tones or communication calibration signals were described above, other configurations are possible.

The alignment filter 41 receives the channel-to-channel observation signal, which the alignment filter 41 can use to remove phase and/or gain mismatch between the low frequency compensated quadrature receiver channel and the high frequency compensated quadrature receiver channel. For example, the alignment filter 41 can use the channel-to-channel observation signal to generate I and Q aligned high frequency compensated signals having substantially equal magnitude and/or phase relative to the I and Q aligned low frequency compensated signals, respectively. In certain embodiments, the channel-to-channel observation signal can be processed by a processor, such as an embedded processor, which can generate control signals for the alignment filter 41. Configuring the reconstruction filter in this manner can reduce the alignment filter's size and/or complexity.

In certain implementations herein, the common mode phase and/or gain error associated with the outputs of a reconstruction filter can be less than or equal to an error of a particular ADC that serves as a reference for alignment. For example, in one embodiment, the common mode and/or gain error associated with the I and Q output signals $O_I$, $O_Q$ can be less than the common mode and/or gain error associated with the ADC used to generate the I low frequency receive signal $L_I$. However, other configurations are possible.

The merge filter 42 can be used to combine the I and Q aligned low frequency compensated signals generated by the first and second delay blocks 37, 38, respectively, with the I and Q aligned high frequency compensated signals generated by the alignment filter 41. In certain configurations, the merge filter 42 can generate the I and Q output signals $O_I$, $O_Q$ based on providing correction in the frequency domain, such as by on summing the signals received as inputs with different weighting coefficients versus frequency. However, other configurations are possible, including, for example configuration which provide correction in the time domain. In certain configurations, the merge filter 42 can attenuate the input signals before summing them, such that a noise power in the output signals over frequency is less than or equal to about the lessor of the noise power of each individual input channel. Accordingly, in certain implementations, I and Q output signals can have a reduced noise profile, while still maintaining a desired gain and phase relationship.

Although FIG. 3A illustrates one example of a reconstruction filter in accordance with the teachings herein, other configurations are possible, including, for example, configurations using different blocks and/or a different arrangement of blocks.

Figure 3B:
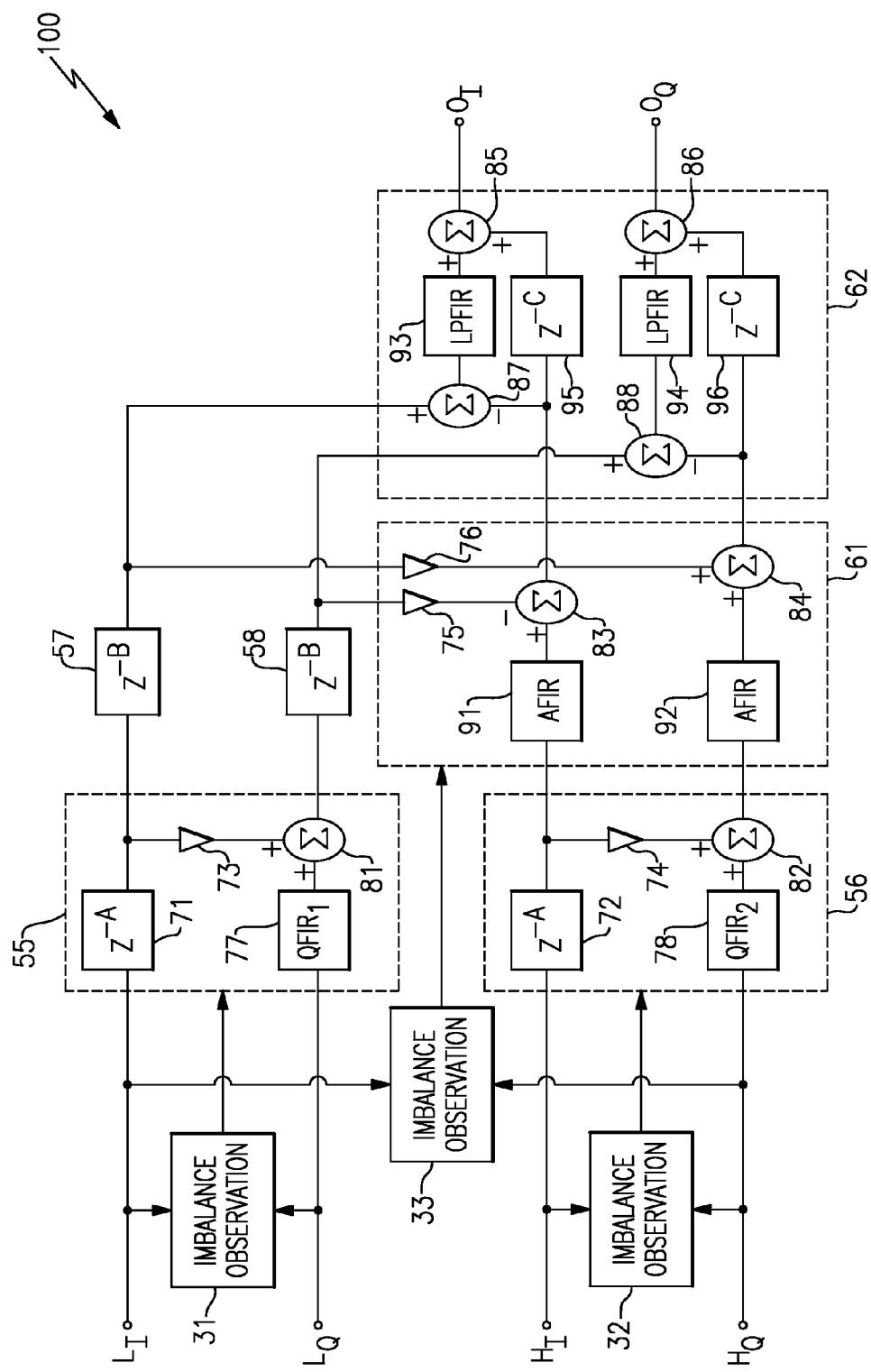
FIG. 3B is a schematic block diagram of one implementation of the reconstruction filter of FIG. 3A.

FIG. 3B is a schematic block diagram of one implementation of the reconstruction filter of FIG. 3A. The illustrated reconstruction filter 100 includes the first channel imbalance observation block 31, the second channel imbalance observation block 32, the channel-to-channel imbalance observation block 33, a first QE correction block 55, a second QE correction block 56, a first delay block 57, a second delay block 58, an alignment filter 61, and a merge filter 62.

As was described earlier, the first channel imbalance observation block 31 can be used to observe an IQ imbalance between the I and Q low frequency compensated receive signals $L_I$ and $L_Q$, and the second channel imbalance observation block 32 can be used to observe an IQ imbalance between the I and Q high frequency compensated receive signals $H_I$ and $H_Q$. The first channel imbalance observation block 31 can generate a first imbalance observation signal, and the second channel imbalance observation block 32 can generate a second imbalance observation signal. Additionally, the channel-to-channel imbalance observation block 33 can be used to generate a channel-to-channel observation signal indicating a gain and/or a phase difference between the I low frequency compensated receive signal $L_I$ and the Q high frequency compensated receive signal $H_Q$.

The first QE correction block 55 includes a first delay block 71, a first variable gain block 73, a first quadrature-phase finite impulse response (QFIR) filter 77, and a first QE correction adder 81. Additionally, the second QE correction block 56 includes a second delay block 72, a second variable gain block 74, a second QFIR filter 78, and a second QE correction adder 82.

The first QE correction block 55 can be used to correct for a quadrature error of the low frequency compensated quadrature receiver channel by correcting for gain and/or shifting a phase of the Q low frequency compensated receive signal relative to the I low frequency compensated receive signal based on the first imbalance observation signal. As used herein, quadrature error can refer to a differential gain and/or phase error between the Q signal and I signal of a particular channel.

In one embodiment, the Q corrected low frequency compensated receive signal can be generated by a weighted sum of the I low frequency compensated receive signal $L_I$ and delayed versions of the Q low frequency compensated receive signal $L_Q$. Additionally, the first imbalance observation signal can be used to control the filter coefficients of the first QFIR filter 77 and a gain of the first variable gain block 73. Thus, the first QFIR filter 77 and the first variable gain block 73 can operate to correct gain and/or phase mismatch of the Q low frequency compensated receive signal $L_Q$ with respect to the I low frequency compensated receive signal $L_I$.

Similarly, the second QE correction block 56 can be used to correct for a quadrature error of the high frequency compensated quadrature receiver channel by correcting for gain and/or shifting a phase of the Q high frequency compensated receive signal relative to the I high frequency compensated receive signal based on the second imbalance observation signal. For example, the second imbalance observation signal can be used to control the filter coefficients of the second QFIR filter 78 and a gain of the second variable gain block 74.

The first and second delay blocks 71, 72 can be used to align the signals summed by the first and second QE correction adders 81, 82. For example, in one embodiment, the first and second delay blocks 71, 72 have a delay A, which can be selected to be equal to the group delay of the first and second QFIR filters 77, 78.

As shown in FIG. 3B, the alignment filter 61 includes a first alignment finite impulse response (AFIR) filter 91, a second AFIR filter 92, a first alignment filter subtractor 83, a first alignment filter adder 84, a third variable gain block 75, and a fourth variable gain block 76. The third variable gain block 75 includes an input that receives the Q aligned low frequency compensated signal, and an output electrically connected to a minus input of the first alignment filter subtractor 83. The first AFIR filter 91 includes an input that receives the I corrected high frequency compensated signal, and an output electrically connected to a plus input of the first alignment filter subtractor 83. The first alignment filter subtractor 83 further includes an output that generates the I aligned high frequency compensated signal by subtracting the output of the third variable gain block 75 from the output of the first AFIR filter 91. The fourth variable gain block 76 includes an input that receives the I aligned low frequency compensated signal, and an output electrically connected to a first input of the first alignment filter adder 84. The second AFIR filter 92 includes an input that receives the Q corrected high frequency compensated signal, and an output electrically connected to a second input of the first alignment filter adder 84. The first alignment filter adder 84 further includes an output that generates the Q aligned high frequency compensated signal.

In the illustrated configuration, the alignment filter 61 can operate similar to the first and second QE correction blocks 55, 56 described above. For example, the alignment filter 61 can be used to correct for channel-to-channel imbalance by correcting for gain and/or shifting a phase of the I and Q corrected high frequency compensated receive signals relative to the I and Q corrected low frequency compensated receive signals based on the channel-to-channel observation signal. For instance, the I aligned high frequency compensated receive signal can be generated by a weighted sum of the Q aligned low frequency compensated signal and delayed versions of the I corrected high frequency compensated receive signal, and the channel-to-channel observation signal can be used to control the filter coefficients of the first AFIR filter 91 and a gain of the third variable gain block 75. Additionally, the Q aligned high frequency compensated receive signal can be generated by a weighted sum of the I aligned low frequency compensated receive signal and delayed versions of the Q corrected high frequency compensated receive signal, and the channel-to-channel observation signal can be used to control the filter coefficients of the second AFIR filter 92 and a gain of the fourth variable gain block 76. In certain configurations, the first and second delay blocks 57, 58 have a delay B, which can be selected to be equal to the group delay of the first and second AFIR filters 91, 92.

In the illustrated configuration, the alignment filter 61 adjusts a filtered I signal generated by the first AFIR 91 using a scaled version of the Q aligned low frequency compensated signal, and adjusts a filtered Q signal generated by the second AFIR 92 using a scaled version of the I aligned low frequency compensated signal. The phase difference associated with adjusting an I signal based on a Q signal relative to adjusting a Q signal based on an I signal can be compensated for by using the first alignment filter subtractor 83 to generate the I aligned high frequency compensated signal and by using the first alignment filter adder 84 to generate the Q aligned high frequency compensated signal. However, other configurations are possible. For example, in one implementation, the first alignment filter subtractor 83 is omitted in favor of using an adder, and the sign of the gain of the third variable gain block 75 is inverted relative to the sign of the gain of the fourth variable gain block 76.

The illustrated alignment filter 61 can be used to correct for gain and/or phase errors of the high frequency compensated and low frequency compensated quadrature receiver channels. In the illustrated configuration, the low frequency compensated receive signal $L_I$ serves as a reference for alignment. However, other configurations are possible. Matching channels using the alignment filter 61 can aid in reducing an amount of common mode gain and/or phase error associated with subsequent merge filtering.

In the illustrated configuration, the merge filter 62 includes first and second merge filter adders 85, 86, first and second merge filter subtractors 87, 88, first and second low pass finite impulse response (LPFIR) filters 93, 94, and fifth and sixth delay blocks 95, 96. As shown in FIG. 3B, the first merge filter subtractor 87 subtracts the I aligned high frequency compensated receive signal from the I aligned low frequency compensated receive signal, and the first LPFIR filter 93 filters the output of the first merge filter subtractor 87. The fifth delay block 95 delays the I aligned high frequency compensated receive signal, and the first merge filter adder 85 sums the output of the first LPFIR filter 93 and the output of the fifth delay block 95 to generate the I output signal $O_I$. Similarly, the second merge filter subtractor 88 subtracts the Q aligned high frequency compensated receive signal from the Q aligned low frequency compensated receive signal, and the second LPFIR filter 94 filters the output of the second merge filter subtractor 88. Additionally, the sixth delay block 96 delays the Q aligned high frequency compensated receive signal, and the second merge filter adder 86 sums the output of the second LPFIR filter 94 and the output of the sixth delay block 96 to generate the Q output signal $O_Q$.

The illustrated merge filter 62 can have a gain of about 1. For example, the I and Q output signals $O_I$, $O_Q$ can be generated based on low pass filtering the I and Q signals associated with the low frequency compensated quadrature receiver channel, high pass filtering I and Q signals associated with the high frequency compensated quadrature receiver channel, and summing the results. Although the illustrated configuration does not include an explicit high pass filter in the merge filter 62, high pass filtering of the I and Q high frequency aligned signals is implicitly provided in part by subtracting an output of a low pass filter from an output of an all pass filter. In particular, the fifth and sixth delay blocks 95, 96 can operate as all pass filters having a delay C, which can be selected to be equal to the group delay of the first and second LPFIR filters 93, 94. The collective operation of the first merge filter subtractor 87, the first LPFIR filter 93, the fifth delay block 95, and the first merge filter adder 85 can be to low pass filter the I aligned low frequency compensated receive signal, high pass filter the I aligned high frequency compensated receive signal, and sum the results to generate the I output signal $O_I$ with substantially unity gain. Similarly, the collective operation of the second merge filter subtractor 88, the second LPFIR filter 94, the sixth delay block 96, and the second merge filter adder 86 can be to low pass filter the Q aligned low frequency compensated receive signal, high pass filter the Q aligned high frequency compensated receive signal, and sum the results to generate the Q output signal $O_Q$ with substantially unity gain.

Configuring the merge filter 62 in this manner can result in the I and Q outputs signals $O_I$, $O_Q$ having reduced noise power over frequency without substantially degrading the common mode error over frequency removed by the alignment filter 41, and/or the quadrature error removed by the first and second QE correction blocks 55, 56. As used herein, common mode error can refer to a differential gain and/or phase error between I signals or Q signals associated with different channels.

In certain implementations, the merge filter 62 can have a corner frequency selected to achieve a desired transition from the low frequency compensated quadrature receiver channel being dominant to the generation of the I and Q output signals $O_I$, $O_Q$ to the high frequency compensated quadrature receiver channel being dominant to the generation of the I and Q output signals I and Q. For example, when the high frequency compensated quadrature receiver channel and the low frequency quadrature compensated receiver channel have noise profiles similar to those shown in FIG. 2, a corner frequency of about 45 MHz could be selected for the merge filter 62, such that below the corner frequency the low pass noise profile 21 can dominate generation of the output signals and such that above the corner frequency the band pass noise profile 22 can dominate generation of the output signals. Although one specific example of noise profiles has been described, other noise profiles and/or corner frequencies are possible.

The illustrated merge filter 62 can provide a reduction in overall noise. For example, in certain configurations, a noise power present in the I and Q output signals $O_I$, $O_Q$ generated by the merge filter 62 can be about 3 dB less than a greater of the noise powers of the high frequency quadrature receiver channel and the low frequency quadrature receiver channel when the noise powers of the channels are substantially uncorrelated. The reduction in noise power in the output signals can lead to a relaxed merge filter roll-off constraint. Additionally, when the low frequency and high frequency quadrature receiver channels have a sufficient overlap of low noise power bandwidths, an implementation cost of the merge filter can be reduced. For instance, in certain implementations, the first and second LPFIR filters 93, 94 can be implemented with a relatively small number of filter taps, where coefficients associated with these filter taps may use as little as one bit to express. However, other configurations are possible.

Although FIG. 3B illustrates of one implementation of the reconstruction filter 30 of FIG. 3A, other configurations are possible. For instance, although the illustrated QE correction blocks 55, 56, the alignment filter 61, and the merge filter 62 are illustrated as including finite impulse response (FIR) filters, the teachings herein are applicable to other configurations, such as implementations using infinite impulse response (IIR) filters, or a combination of FIR and IIR filters.

Figure 3C:
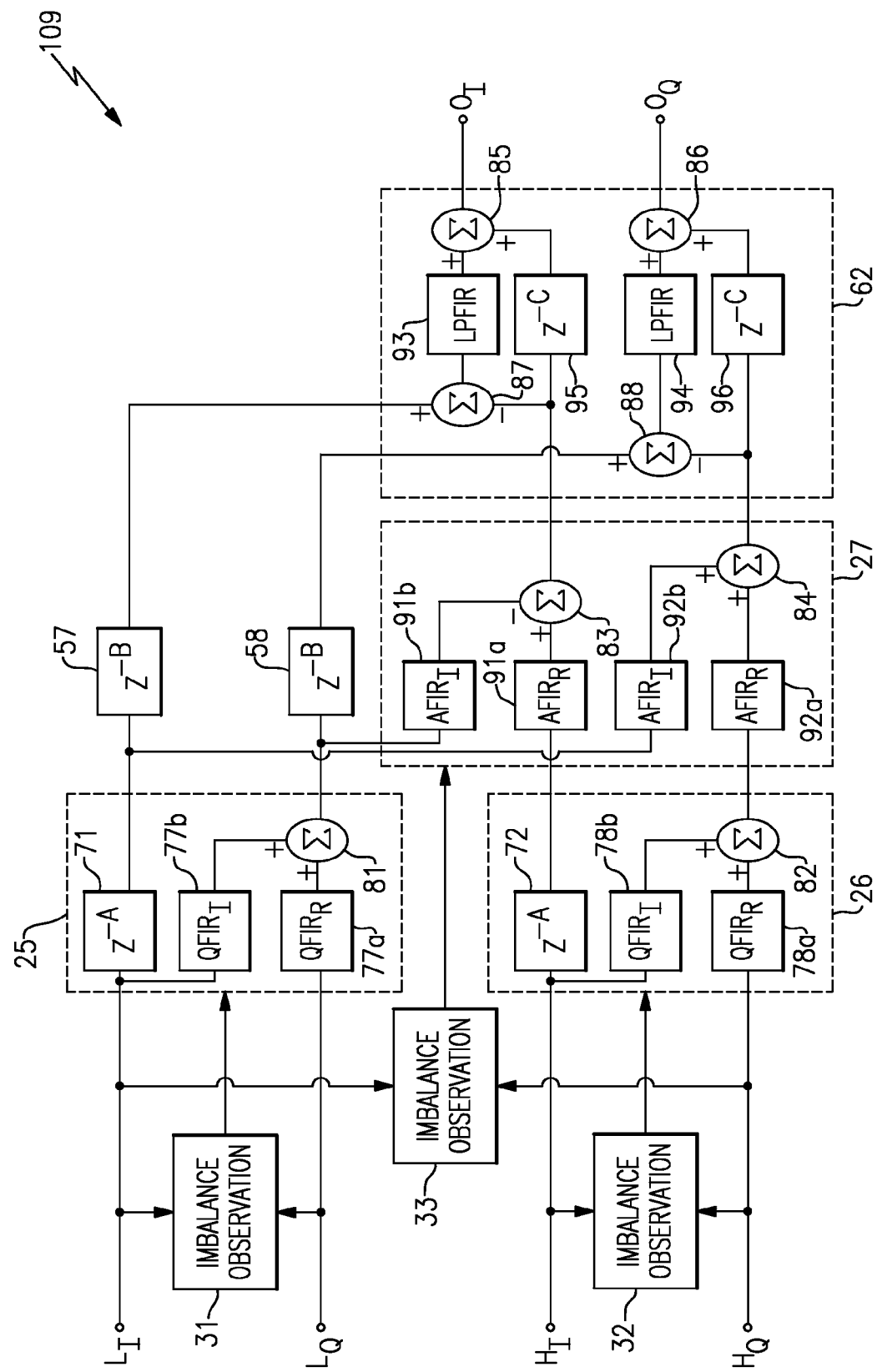
FIG. 3C is a schematic block diagram of another implementation of the reconstruction filter of FIG. 3A.

FIG. 3C is a schematic block diagram of another implementation of the reconstruction filter 30 of FIG. 3A. The illustrated reconstruction filter 109 includes the first channel imbalance observation block 31, the second channel imbalance observation block 32, the channel-to-channel imbalance observation block 33, the first and second delay blocks 57, 58, and the merge filter 62, which can be as described earlier. The reconstruction filter 109 further includes a first QE correction block 25, a second QE correction block 26, and an alignment filter 27.

The reconstruction filter 109 of FIG. 3C is similar to the reconstruction filter 100 of FIG. 3B, except that the reconstruction filter 109 includes a different configuration of QE correction blocks and of an alignment filter.

For example, the first QE correction block 25 of FIG. 3C includes a first delay block 71, a first real coefficient QFIR filter 77a, a first imaginary coefficient QFIR filter 77b, and a first QE correction adder 81. Additionally, the second QE correction block 26 of FIG. 3C includes a second delay block 72, a second real coefficient QFIR filter 78a, a second imaginary coefficient QFIR filter 78b, and a second QE correction adder 82. The first delay block 71 includes an input that receives the I low frequency compensated receive signal $L_I$, and an output that generates the I corrected low frequency compensated receive signal. Additionally, the first real coefficient QFIR filter 77a includes an input that receives the Q low frequency compensated receive signal $L_Q$, and an output electrically connected to a first input of the first QE correction adder 81. Furthermore, the first imaginary coefficient QFIR filter 77b includes an input that receives the I low frequency compensated receive signal $L_I$, and an output electrically connected to a second input of the first QE correction adder 81. The first QE correction adder 81 further includes an output that generates the Q corrected low frequency compensated receive signal. The second delay block 72 includes an input that receives the I high frequency compensated receive signal $H_I$, and an output that generates the I corrected high frequency compensated receive signal. Additionally, the second real coefficient QFIR filter 78a includes an input that receives the Q high frequency compensated receive signal $H_Q$, and an output electrically connected to a first input of the second QE correction adder 82. Furthermore, the second imaginary coefficient QFIR filter 78b includes an input that receives the I high frequency compensated receive signal $H_I$, and an output electrically connected to a second input of the second QE correction adder 82. The second QE correction adder 82 further includes an output that generates the Q corrected high frequency compensated receive signal.

The illustrated alignment filter 27 includes a first real coefficient AFIR filter 91a, a first imaginary coefficient AFIR filter 91b, a second real coefficient AFIR filter 92a, a second imaginary coefficient AFIR filter 92b, a first alignment filter subtractor 83, and a first alignment filter adder 84. The first real coefficient AFIR filter 91a includes an input that receives the I corrected high frequency compensated receive signal, and an output electrically connected to a plus input of the first alignment filter subtractor 83. The first imaginary coefficient AFIR filter 91b includes an input that receives the Q corrected low frequency compensated receive signal, and an output electrically connected to a minus input of the first alignment filter subtractor 83. The first alignment filter subtractor 83 further includes an output that generates the I aligned high frequency compensated receive signal by subtracting the output of the first imaginary coefficient AFIR filter 91b from the output of the first real coefficient AFIR filter 91a. The second real coefficient AFIR filter 92a includes an input that receives the Q corrected high frequency compensated receive signal, and an output electrically connected to a first input of the first alignment filter adder 84. The second imaginary coefficient AFIR filter 92b includes an input that receives the I corrected low frequency compensated receive signal, and an output electrically connected to a second input of the first alignment filter adder 84. The first alignment filter adder 84 further includes an output that generates the Q aligned high frequency compensated receive signal.

Although FIG. 3C illustrates the alignment filter 27 as including the first alignment filter subtractor 83 and the first alignment filter adder 84, other configurations are possible. For example, in one implementation, the first alignment filter subtractor 83 is omitted in favor of using an adder, and a sign of the coefficients of the first imaginary coefficient AFIR filter 91b are inverted relative to a sign of the coefficients of the second imaginary coefficient AFIR filter 92b.

The illustrated alignment filter 27 of FIG. 3C can be used to provide enhanced alignment correction relative to the alignment filter 61 of FIG. 3B. For example, the alignment filter 27 generates the I aligned high frequency compensated receive signal based on a sum of the outputs of real coefficient AFIR filter and an imaginary coefficient AFIR filter, and generates the Q aligned high frequency compensated receive signal based on a sum of the outputs of a real coefficient AFIR filter and an imaginary coefficient AFIR filter. The illustrated configuration of AFIR filters can operate to provide phase and/or gain adjustment, which can be non-symmetric with respect to receive signal polarity. For instance, the alignment filter 27 can be used to provide, for example, separate gain and/or phase adjustments to frequencies that are about equal amounts above or below a local oscillator frequency used to generate the receive signal. Accordingly, the illustrated configuration can use real and imaginary filter taps to adjust gain and phase of a Q signal to provide arbitrary gain and/or phase adjustment over frequency. In contrast, a correction scheme using only a real filter may have limitations in correcting gain and/or phase imbalances. For instance, a real filter may be limited to providing the same amount of gain adjustment at frequencies an equal amount above or below a local oscillator frequency and/or limited to providing phase adjustments of equal magnitude and opposite polarity at such frequencies.

The illustrated first and second QE correction blocks 25, 26 can also provide enhanced quadrature error correction relative to the first and second QE correction blocks 55, 56 of FIG. 3B. For example, the first QE correction block 25 generates the Q corrected low frequency compensated receive signal based on a sum of the outputs of a real coefficient AFIR filter and an imaginary coefficient AFIR filter, and the second QE correction block 26 generates the Q corrected high frequency compensated receive signal based on a sum of the outputs of a real coefficient AFIR filter and an imaginary coefficient AFIR filter. Accordingly, the first and second QE correction blocks 25, 26 can be used to provide phase and/or gain, which can be non-symmetric with respect to receive signal polarity. In certain configurations, the first and second QE correction blocks 25, 26 can be used to provide for gain and/or phase corrections in configurations in which pairs of ADCs receive different I and Q signals relative to one another, such as in configurations similar to that of the electronic system 19 of FIG. 1B.

Although the reconstruction filter 109 of FIG. 3C can be used to provide enhanced quadrature error correction and/or alignment correction relative to the reconstruction filter 100 of FIG. 3B, the reconstruction filter 109 of FIG. 3C may also be larger, more expensive and/or consume larger amounts of power relative to the configuration shown in FIG. 3B.

Figure 3D:
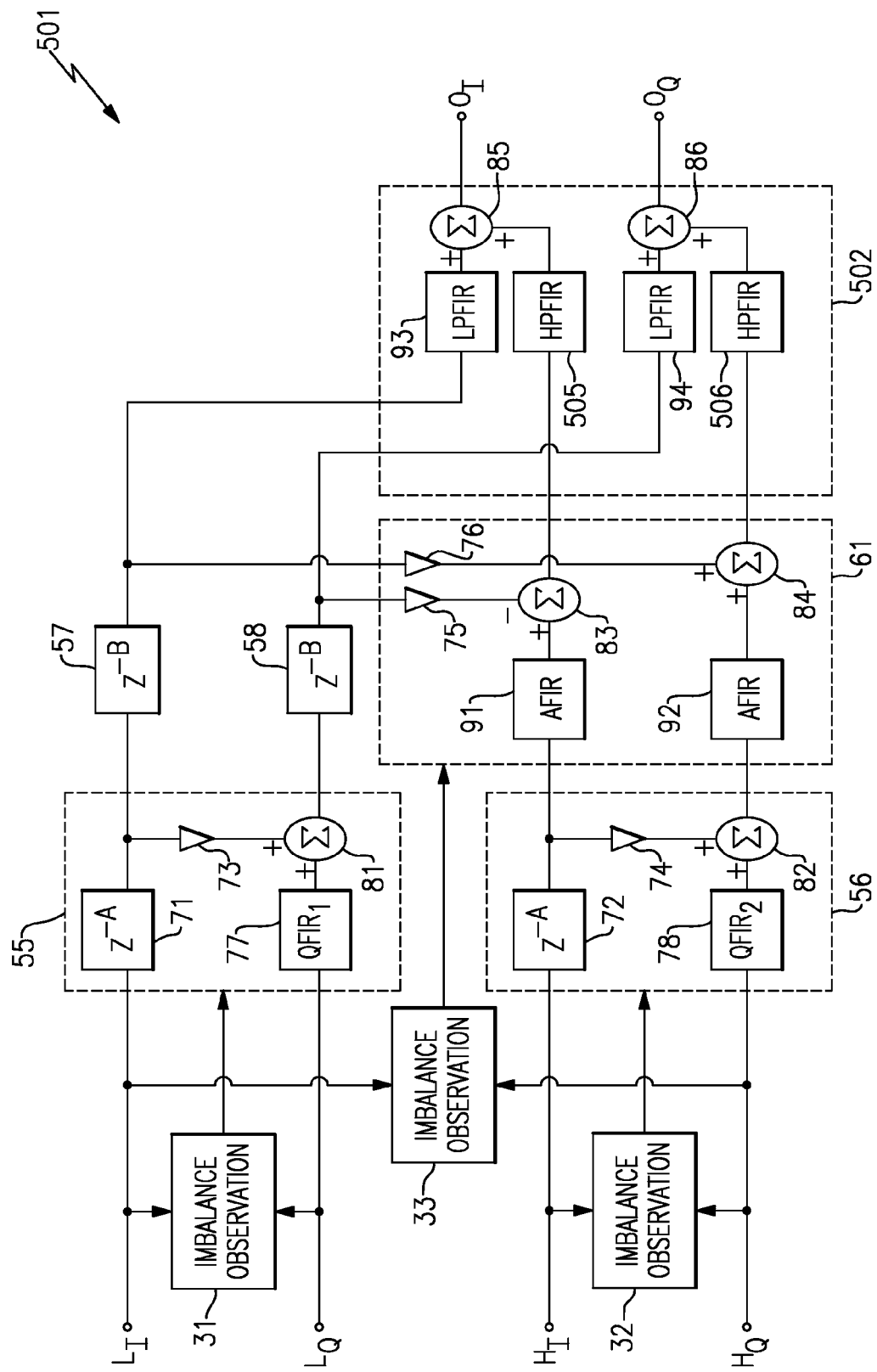
FIG. 3D is a schematic block diagram of another implementation of the reconstruction filter of FIG. 3A.

FIG. 3D is a schematic block diagram of another implementation of the reconstruction filter 30 of FIG. 3A. The illustrated reconstruction filter 501 includes the first channel imbalance observation block 31, the second channel imbalance observation block 32, the channel-to-channel imbalance observation block 33, the first and second QE correction blocks 55, 56, the first and second delay blocks 57, 58, and the alignment filter 41, which can be as described earlier. The reconstruction filter 109 further includes a merge filter 502.

The reconstruction filter 501 of FIG. 3D is similar to the reconstruction filter 100 of FIG. 3B, except that the reconstruction filter 501 includes a different configuration of a merge filter.

For example, the illustrated merge filter 502 includes first and second low pass finite impulse response LPFIR filters 93, 94, first and second high pass finite impulse response (HPFIR) filters 505, 506, and first and second merge filter adders 85, 86. As shown in FIG. 3D, the first LPFIR filter 93 low pass filters the I aligned low frequency compensated receive signal to generate a low pass filtered I signal, and the first HPFIR filter 505 high pass filters the I aligned high frequency compensated receive signal to generate a high pass filtered I signal. Furthermore, in the illustrated configuration, the first merge filter adder 85 sums the low pass filtered I signal and the high pass filtered I signal to generate the I output signal $O_I$. Additionally, the second LPFIR filter 94 low pass filters the Q aligned low frequency compensated receive signal to generate a low pass filtered Q signal, and the second HPFIR filter 506 high pass filters the Q aligned high frequency compensated receive signal to generate a high pass filtered Q signal. Furthermore, in the illustrated configuration, the second merge filter adder 86 sums the low pass filtered Q signal and the high pass filtered Q signal to generate the Q output signal $O_Q$.

The illustrated configuration generates the I output signal $O_I$ based on summing the output of a low pass filter and a high pass filter. Similarly, the illustrated configuration generates the Q output signal $O_Q$ based on summing the output of a low pass filter and a high pass filter. In contrast to the configuration shown in FIG. 3B which includes implicit high pass filters, the illustrated configuration includes explicit high pass filters. Accordingly, the illustrated configuration may be more costly to implement and/or may not have unity gain over frequency due to mismatch between the transfer functions of the high pass filters and low pass filters.

Figure 3E:
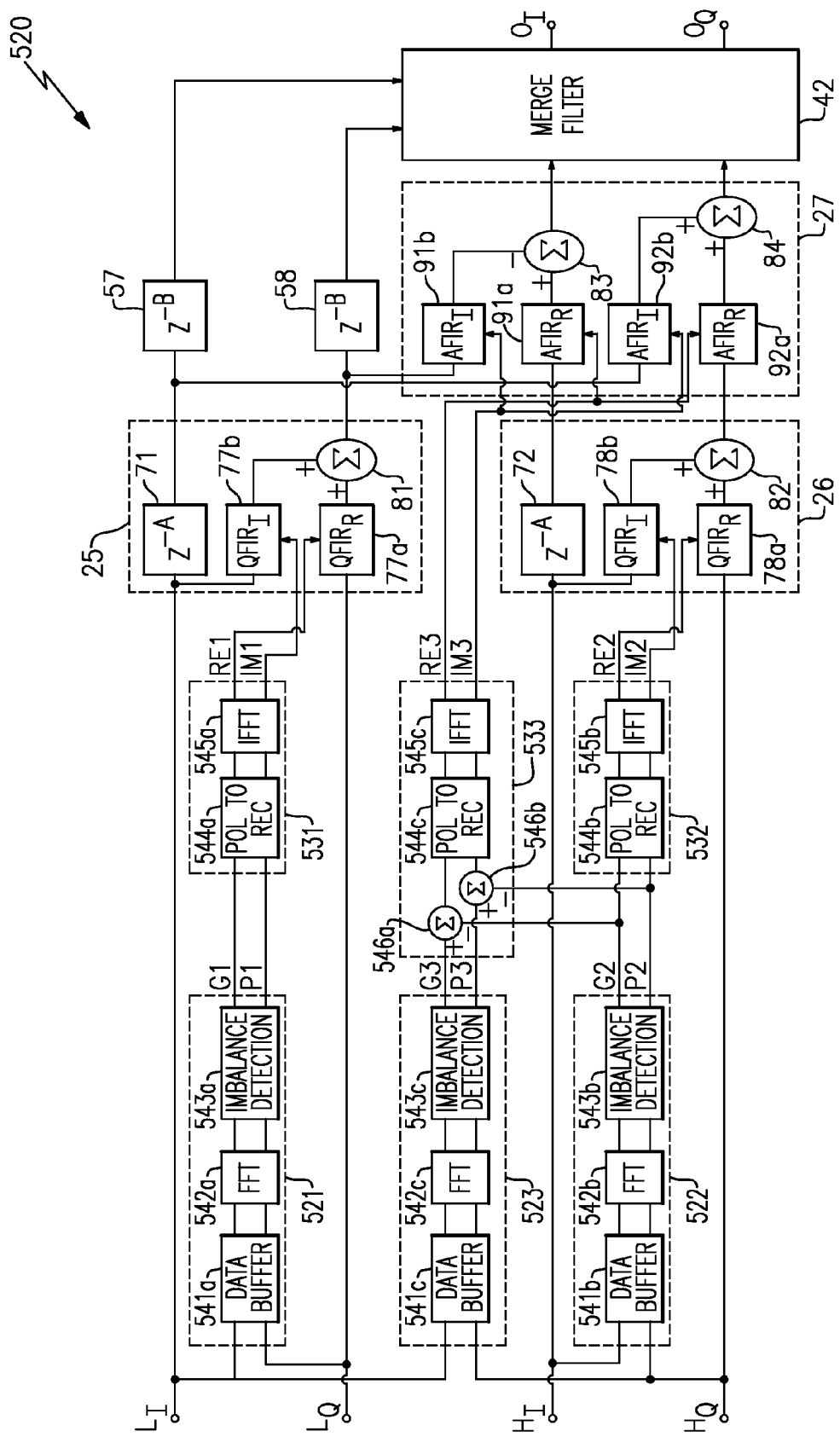
FIG. 3E is a schematic block diagram of another implementation of the reconstruction filter of FIG. 3A.

FIG. 3E is a schematic block diagram of another implementation of the reconstruction filter 30 of FIG. 3A. The illustrated reconstruction filter 520 includes the first and second QE correction blocks 25, 26, the alignment filter 27, the first and second delay blocks 57, 58, and the merge filter 62, which can be as described earlier. The reconstruction filter 520 further includes a first channel imbalance observation block 521, a second channel imbalance observation block 522, a channel-to-channel imbalance observation block 523, a first filter coefficient determination block 531, a second filter coefficient determination block 532, and a third filter coefficient determination block 533.

The first channel imbalance observation block 521 includes a first data buffer 541a, a first fast Fourier transform (FFT) block 542a, and a first imbalance detection block 543a. The first data buffer 541a receives the I low frequency compensated receive signal $L_I$ and the Q low frequency compensated receive signal $L_Q$, and generates first I and Q buffered signals. The first FFT block 542a receives the first I and Q buffered signals, and generates first I and Q transformed signals based on a FFT. The first imbalance detection block 543a receives the first I and Q transformed signals, and generates a first gain observation signal and a first phase observation signal, which collectively operate as a first imbalance observation signal in this example. The first gain observation signal and the first phase observation signal can indicate an amount of gain correction and an amount of phase correction to correct an I/Q imbalance of the first channel. The second channel imbalance observation block 522 includes a second data buffer 541b, a second FFT block 542b, and a second imbalance detection block 543b. The second data buffer 541b receives the I high frequency compensated receive signal $H_I$ and the Q high frequency compensated receive signal $H_Q$, and generates second I and Q buffered signals. The second FFT block 542b receives the second I and Q buffered signals, and generates second I and Q transformed signals. The second imbalance detection block 543b receives the second I and Q transformed signals, and generates a second gain observation signal and a second phase observation signal, which collectively operate as a second imbalance observation signal in this example.

The channel-to-channel imbalance observation block 523 includes a third data buffer 541c, a third FFT block 542c, and a third imbalance detection block 543c. The third data buffer 541c receives the I low frequency compensated receive signal $L_I$ and the Q high frequency compensated receive signal $H_Q$, and generates third I and Q buffered signals. The third FFT block 542c receives the third I and Q buffered signals, and generates third I and Q transformed signals. The third imbalance detection block 543c receives the third I and Q transformed signals, and generates a third gain observation signal and a third phase observation signal, which collectively operate as a channel-to-channel observation signal in this example. Although FIG. 3E illustrates a configuration in which a channel-to-channel imbalance observation block is implemented using a similar configuration as the first and second imbalance observation blocks, other configurations are possible.

The illustrated reconstruction filter 520 further includes the first to third filter coefficient determination blocks 531-533. The first filter coefficient determination block 531 includes a first polar to rectangular converter 544a and a first inverse fast Fourier transform (IFFT) block 545a. The first polar to rectangular converter 544a receives the first gain observation signal and the first phase observation signal, and generates first real and imaginary signals based on a polar to rectangular conversion. The first IFFT block 545a receives the first real and imaginary signals and generates first real filter coefficients for the first real coefficient QFIR filter 77a and first imaginary filter coefficients for the first imaginary coefficient QFIR filter 77b based on an inverse FFT. The second filter coefficient determination block 532 includes a second polar to rectangular converter 544b and a second IFFT block 545b. The second polar to rectangular converter 544b receives the second gain observation signal and the second phase observation signal, and generates second real and imaginary signals. The second IFFT block 545b receives the second real and imaginary signals and generates second real filter coefficients for the second real coefficient QFIR filter 78a and second imaginary filter coefficients for the second imaginary coefficient QFIR filter 78b.

The third filter coefficient determination block 533 includes a third polar to rectangular converter 544c, a third IFFT block 545c, a first coefficient determination subtractor 546a, and a second coefficient determination subtractor 546b. The first coefficient determination subtractor 546a subtracts the third gain observation signal from the second gain observation signal to generate a gain difference signal. The second coefficient determination subtractor 546b subtracts the third phase observation signal from the second phase observation signal to generate a phase difference signal. The third polar to rectangular converter 544c receives the gain difference signal and the phase difference signal, and generates third real and imaginary signals. The third IFFT block 545c receives the third real and imaginary signals and generates third real filter coefficients for the first and second real coefficient AFIR filters 91a, 92a and third imaginary filter coefficients for the first and second imaginary coefficient AFIR filters 91b, 92b.

As shown in FIG. 3E, the first and second filter coefficient determination blocks 531, 532 generate filter coefficients for filters in the first and second QE correction blocks 25, 26, respectively, and the third filter coefficient determination block 533 generates filter coefficients for filters in the alignment filter 27. In certain configurations, all or part of the first to third filter coefficient determination blocks 531-533 and/or the first to third imbalance observation blocks 521-523 are implemented using a processor. However, other configurations are possible. For example, in one embodiment, the first filter coefficient determination block 531 is implemented as part of the first QE correction block 25, the second filter coefficient determination block 532 is implemented as part of the second QE correction block 26, and the third filter coefficient determination block 533 is implemented as part of the alignment filter 27.

The illustrated imbalance observation blocks 521-523 can be used to measure gain and phase mismatch over frequency. The illustrated configuration identifies gain and phase correction prior to transformation to generate filter coefficients. Configuring a reconstruction filter in this manner can aid in providing gain and phase adjustments over frequency.

In the illustrated configuration, channel-to-channel observation is performed by comparing the I low frequency compensated receive signal $L_I$ to the Q high frequency compensated receive signal $H_Q$. Configuring the reconstruction filter in this manner can permit the channel-to-channel observation block to have a similar structure as the first and second QE correction blocks. However, other configurations are possible, such as implementations in which a channel-to-channel observation block compares I signals of different channels and/or Q signals of different channels.

As shown in FIG. 3E, the third filter coefficient determination block 533 determines an amount of channel alignment correction based on subtracting the second gain observation signal from the third gain observation signal, and subtracting the second phase observation signal from the third phase observation signal. Accordingly, the illustrated configuration corrects for initial channel-to-channel mismatch, less the mismatch which the second QE correction block 26 applies prior to channel alignment using the alignment filter 27. However, other configurations are possible. For example, the first and second coefficient determination subtractors 546a, 546b can be omitted in configurations in which a channel-to-channel imbalance observation block generates a channel-to-channel imbalance signal by comparing I signals of different channels or Q signals of different channels.

Figure 4A:
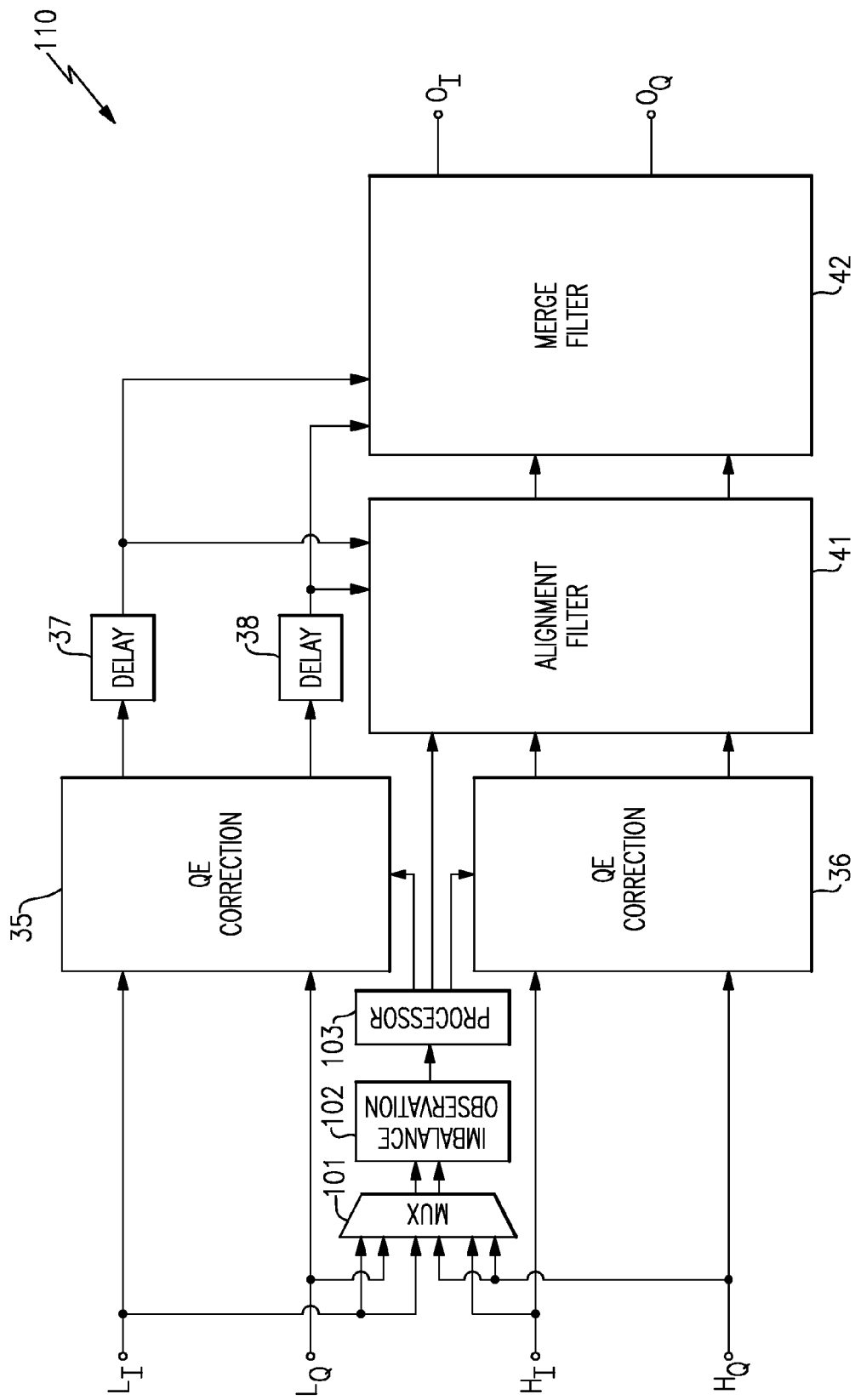
FIG. 4A is a schematic block diagram of another embodiment of a reconstruction filter.

FIG. 4A is a schematic block diagram of one embodiment of a reconstruction filter 110. The reconstruction filter 110 includes a multiplexer 101, an imbalance observation block 102, a processor 103, the first and second QE correction blocks 35, 36, the first and second delay blocks 37, 38, the alignment filter 41, and the merge filter 42. The reconstruction filter 110 receives the I and Q low frequency compensated receive signals $L_I$, $L_Q$ and the I and Q high frequency compensated receive signals $H_I$, $H_Q$, and generates the I and Q output signals $O_I$, $O_Q$.

The reconstruction filter 110 of FIG. 4A is similar to the reconstruction filter 30 of FIG. 3A, except that the reconstruction filter 100 includes the multiplexer 101, the imbalance observation block 102, and the processor 103, rather than the channel-to-channel imbalance observation block 33 and the first and second channel imbalance observation blocks 31, 32 shown in FIG. 3A.

The illustrated reconstruction filter 110 illustrates a configuration in which the imbalance observation block 102 is multiplexed and time-shared between quadrature receiver channels. For example, the imbalance observation block 102 can observe an IQ imbalance between the I and Q low frequency receive signals $L_I$, $L_Q$ during a first time slot, observe an IQ imbalance between the I and Q high frequency receive signals $H_I$, $H_Q$ during a second time slot, and observe a channel-to-channel imbalance between the I low frequency receive signal $L_I$ and the Q high frequency receive signal $H_Q$ during a third time slot. Additionally, the multiplexer 101 and the imbalance observation block 102 can be used to repeat inter-channel and/or intra-channel observations as needed. By multiplexing and time-sharing an imbalance observation block, a reconstruction filter can have a reduced component count, lower cost, and/or smaller area.

In certain configurations, the first, second, and third time slots can be in any order and/or of any suitable duration. For instance, the order and duration may be predetermined or dynamically controlled by a control circuit that controls the selection of the multiplexer 101. In certain configurations, the order and/or duration of the time slots can be based on information received from an imbalance observation block and/or external instruction or control.

The configuration shown in FIG. 4A also illustrates a scheme in which the imbalance observation block 102 provides the imbalance observation signal to the processor 103, which processes the imbalance observation signal to generate control signals for the alignment filter 41 and the first and second QE correction blocks 35, 36. For example, in certain implementations, the processor 103 can be used to generate gain control signals for variable gain blocks and/or filter coefficients for finite impulse response filters used in the alignment filter 41 and the first and second QE correction blocks 35, 36.

In one embodiment, the processor 103 is an embedded processor used for other computational operations in a transceiver system. Using an embedded processor in this manner can aid in reducing an overall amount of hardware in the transceiver system, relative to a configuration in which a separate processor is used specifically for processing imbalance observation signals. In certain configurations, the processor 103 can receive observation data indicating gain and/or phase errors associated with I and Q receive signals associated with the same or a different channel. Additionally, the processor 103 can be used to process the observation data to calculate correction coefficients, which can be written to one or more QE corrections blocks and/or alignment filters. In certain configurations, the calculation of correction coefficients can be periodic, rather than continuous. For example, a frequency of calculation of the correction coefficients can be based on a desired power consumption level. In some implementations, the configuration of a particular QE correction block or alignment filter can be partial or complete, depending on a previous state of the block or filter and the computed adjustment.

Although FIG. 4A illustrates a reconstruction filter that includes a multiplexer and a processor, the teachings herein are also applicable to other configurations. For example, in certain implementations, one or more QE correction blocks can provide quadrature error correction without the use of processors. Additionally, in some implementations, the multiplexer is omitted in favor of using multiple processors or a multi-input processor configured to process multiple imbalance signals.

Figure 4B:
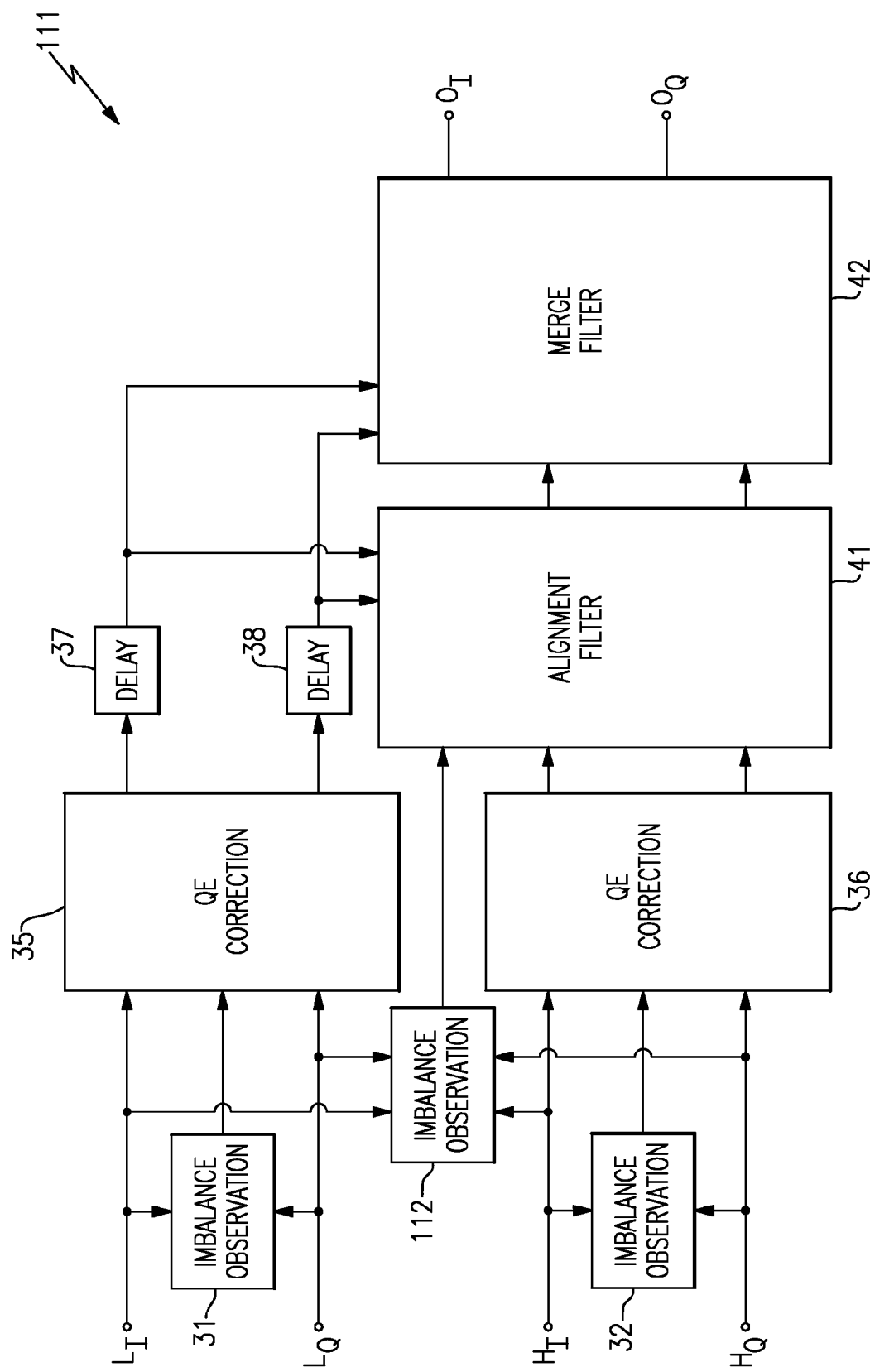
FIG. 4B is a schematic block diagram of another embodiment of a reconstruction filter.

FIG. 4B is a schematic block diagram of another embodiment of a reconstruction filter 111. The reconstruction filter 111 includes first and second channel imbalance observation blocks 31, 32, a channel-to-channel imbalance observation block 112, first and second QE correction blocks 35, 36, first and second delay blocks 37, 38, the alignment filter 41, and the merge filter 42.

The reconstruction filter 111 of FIG. 4B is similar to the reconstruction filter 30 of FIG. 3A, except that the reconstruction filter 111 includes a different implementation of a channel-to-channel imbalance observation block. For example, in contrast to the channel-to-channel imbalance observation block 33 shown in FIG. 3A, the channel-to-channel imbalance observation block 112 shown in FIG. 4A receives both the I and Q low frequency compensated receive signals $L_I$ and $L_Q$ and the I and Q high frequency compensated receive signals $H_I$ and $H_Q$.

In certain implementations, a channel-to-channel observation block can generate a channel-to-channel imbalance signal based on observing both I and Q signals of different quadrature receiver channels.

For example, in certain configurations an imbalance of two quadrature receiver channels can be based on observing channel responses to a calibration signal, such as a calibration tone or a sum of calibration tones. Additionally, when the quadrature receiver channels include ADCs that sample with a rate of X, an I signal or a Q signal alone can be used to represent frequencies between about 0 and about X/2 without aliasing, while both an I signal and a Q signal can be used to represent frequencies between about −X/2 and about X/2 without aliasing. Furthermore, when a channel-to-channel observation is performed in response to a calibration tone having a known polarity, a comparison between an I signal of one channel and an I signal of another channel or a comparison between a Q signal of one channel and a Q signal of another channel may be sufficient to determine an imbalance between the channels. However, when a channel-to-channel observation is performed in response to a calibration tone having an unknown polarity, comparisons between I signals or Q signals alone may be insufficient to determine an imbalance between the channels. For instance, when the tone is negative, the tone can alias, and the polarity of an observed phase difference between the channels should be negated to estimate an actual phase difference. Additionally, when the tone is positive, the tone should not alias, and no negation should be needed to estimate the actual phase difference.

In the illustrated configuration, the channel-to-channel imbalance observation block 112 can be used to compare I and Q signals from two quadrature receiver channels. The illustrated configuration can be used, for example, to identify a channel-to-channel imbalance in configurations using a calibration signal with an unknown polarity, such as in a configuration in which the calibration signal includes one or more calibration tones generated by a separate transmitter. For example, the calibration signal may be generated by a separate transmitter, and may have unknown polarity and/or may not be controlled in a manner to benefit calibration. In the illustrated configuration, I and Q signals from two quadrature receiver channels can be observed, and compared using a comparison between about −X/2 to about X/2, where X is a sample rate of the ADCs associated with the quadrature receiver channels.

With reference back to FIG. 3E, in one embodiment, a channel-to-channel imbalance observation block can be used to compare an I signal of one quadrature receiver channel to a Q signal of another quadrature receiver channel to identify quadrature error mismatch between about −X/2 to about X/2, where X is a sample rate of the ADCs associated with the quadrature receiver channels. In this configuration, the channel-to-channel imbalance observation block and the first and second channel imbalance observation blocks can advantageously be implemented using similar circuitry. Additionally, the channel-to-channel imbalance observation block's observation can be adjusted to identify a correction applied by an alignment filter. For example, in the configuration shown in FIG. 3E, the first and second coefficient determination subtractors 546a, 546b can be used to provide adjustment for the alignment filter's correction.

In another embodiment, a channel-to-channel observation block can be used to compare an I signal of one quadrature receiver channel to an I signal of another quadrature receiver channel, or to compare a Q signal of one quadrature receiver channel to a Q signal of another quadrature receiver channel. Configuring the channel-to-channel observation block in this manner can provide a more direct identification of an alignment filter correction. However, since both I and Q of the receive signals are not considered in unison in this embodiment, receive frequencies outside 0 to X/2 can alias.

In another embodiment, a channel-to-channel observation block can be used to compare the complex signal represented by the I and Q of one quadrature receiver channel to the complex signal represented by I and Q of another quadrature receiver channel. Configuring the channel-to-channel observation block in this manner permits identification of quadrature error mismatch between about −X/2 to about X/2, where X is a sample rate of the ADCs associated with the quadrature receiver channels.

Figure 5A:
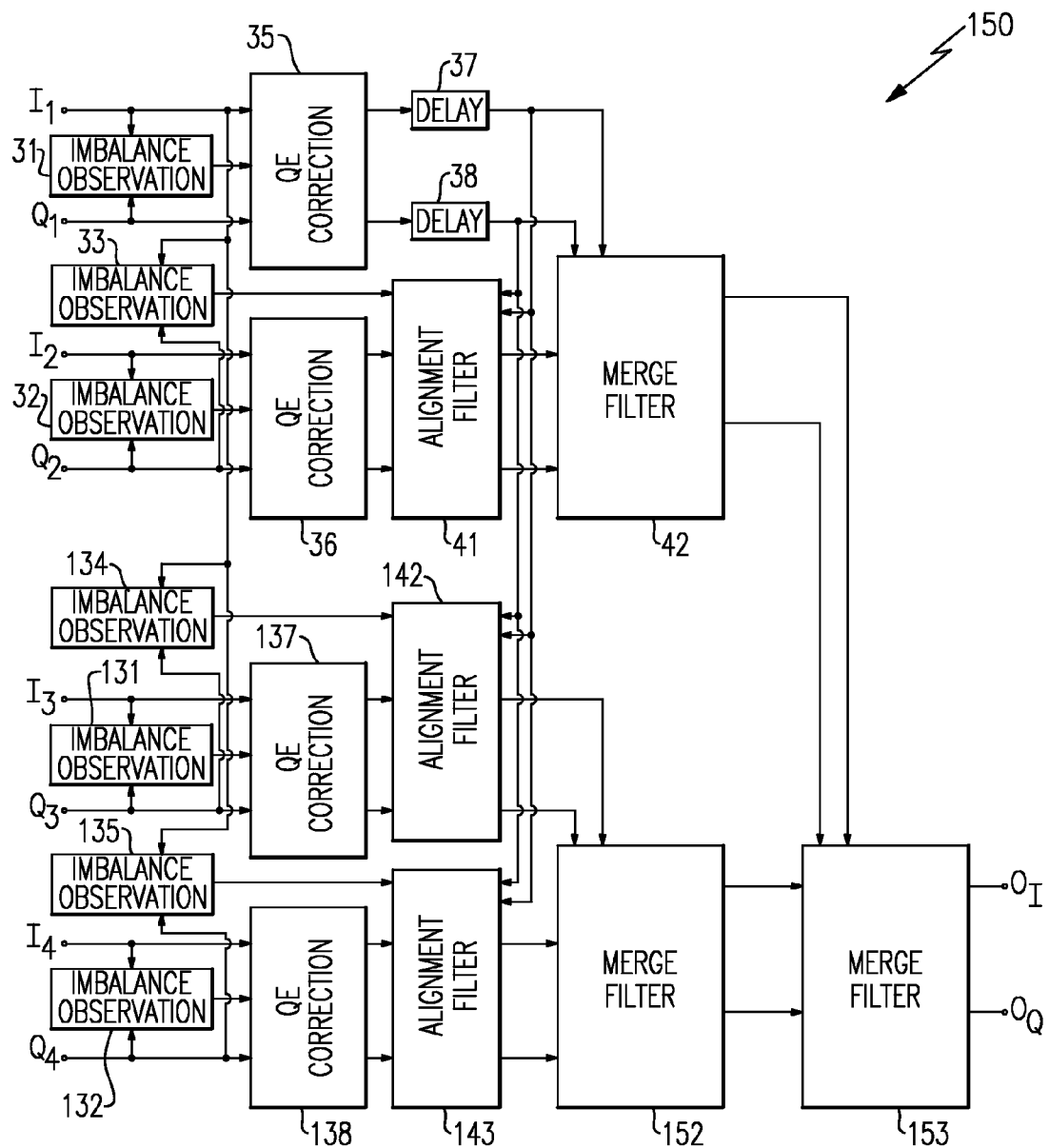
FIG. 5A is a schematic block diagram of another embodiment of a reconstruction filter.

FIG. 5A is a schematic block diagram of another embodiment of a reconstruction filter 150. The reconstruction filter 150 includes the first channel imbalance observation block 31, the second channel imbalance observation block 32, the first channel-to-channel imbalance observation block 33, the first QE correction block 35, the second QE correction block 36, the first delay block 37, the second delay block 38, the first alignment filter 41, and the first merge filter 42, which can be as described earlier with reference to the reconstruction filter 30 of FIG. 3A. The reconstruction filter 150 further includes a third channel imbalance observation block 131, a fourth channel imbalance observation block 132, a second channel-to-channel imbalance observation block 134, a third channel-to-channel imbalance observation block 135, a third QE correction block 137, a fourth QE correction block 138, a second alignment filter 142, a third alignment filter 143, a second merge filter 152, and a third merge filter 153. The illustrated reconstruction filter 150 receives a first I receive signal $I_1$, a first Q receive signal $Q_1$, a second I receive signal $I_2$, a second Q receive signal $Q_2$, a third I receive signal $I_3$, a third Q receive signal $Q_3$, a fourth I receive signal $I_4$, and a fourth Q receive signal $Q_4$. Additionally, the reconstruction filter 150 generates an I output signal $O_I$ and a Q output signal $O_Q$.

The first channel imbalance observation block 31 can generate a first imbalance observation signal corresponding to an IQ imbalance of the first quadrature receiver channel associated with the first I and Q receive signals $I_1$, $Q_1$. Similarly, the second to fourth channel imbalance observation blocks 32, 131, 132 can generate second to fourth imbalance observation signals associated with the second to fourth quadrature receiver channels, respectively. The first channel-to-channel imbalance observation block 33 receives the first I receive signal $I_1$ and the second Q receive signal $Q_2$, and generates a first channel-to-channel observation signal. Similarly, the second and third channel-to-channel imbalance observation blocks 134, 135 receive the first I receive signal $I_1$ and the third and fourth Q receive signals $Q_3$, $Q_4$, respectively, and generate second and third channel-to-channel observation signals. The first QE correction block 35 receives the first imbalance observation signal and I and Q receive signals associated with the first quadrature receiver channel, and generates first channel I and Q corrected signals. Similarly, the second to fourth QE correction blocks 36, 137, 138 receive the second to fourth imbalance observation signals and I and Q signals associated with the second to fourth quadrature receiver channels, respectively, and generate second to fourth channel I and Q corrected signals, respectively.

The first and second delay blocks 37, 38 receive first channel I and Q corrected signals, respectively, and generate first channel I and Q aligned signals. The first alignment filter 41 receives the first channel-to-channel observation signal, the first channel I and Q aligned signals, and the second channel I and Q corrected signals, and generates second channel I and Q aligned signals. The second alignment filter 142 receives the second channel-to-channel observation signal, the first channel I and Q aligned signals, and the third channel I and Q corrected signals, and generates third channel I and Q aligned signals. The third alignment filter 143 receives the third channel-to-channel observation signal, the first channel I and Q aligned signals, and the fourth channel I and Q corrected signals, and generates fourth channel I and Q aligned signals. The first merge filter 42 receives the first channel I and Q aligned signals, the second channel I and Q aligned signals, and generates a first merged I signal and a first merged Q signal. The second merge filter 152 receives the third channel I and Q aligned signals, the fourth channel I and Q aligned signals, and generates a second merged I signal and a second merged Q signal. The third merge filter 153 receives the first and second merged I signals and the first and second merged Q signals, and generates the I and Q output signals $O_I$, $O_Q$.

The illustrated reconstruction filter 150 can be used to combine the outputs of four quadrature receiver channels associated with different noise profiles. For example, the first channel I and Q signals $I_1$, $Q_1$ can be associated with a first noise profile, the second channel I and Q signals $I_2$, $Q_2$ can be associated with a second noise profile, the third channel I and Q signals $I_3$, $Q_3$ can be associated with a third noise profile, and the fourth channel I and Q signals can be associated with a fourth noise profile. Each noise profile can have a lower noise relative to the other noise profiles over a certain frequency range, and the reconstruction filter 150 can be used to selectively combine the I and Q signals associated with the channels over different frequencies to generate output signals having a lower overall noise profile relative to that of any individual channel.

As shown in FIG. 5A, I and Q signals associated with the first and second quadrature receiver channels are merged using the first merge filter 42 to generate the first merged I signal and the first merged Q signal. Additionally, I and Q signals associated with the third and fourth quadrature receiver channels are merged using the second merge filter 152 to generate the second merged I signal and the second merged Q signal. Furthermore, the third merge filter 153 merges the first and second merged I signals to generate the I output signal $O_I$, and the fourth merge filter 154 merges the first and second merged Q signals to generate the Q output signal $O_Q$.

In the illustrated configuration, the first I receive signal $I_1$ is selected as a reference for correction and alignment operations to the other I and Q signals. However, other configurations are possible.

Although FIG. 5A illustrates a configuration using four quadrature receiver channels, the teachings herein are applicable to configurations having more or fewer quadrature receiver channels, including both configurations with an even number of quadrature receiver channels and configurations with an odd number of quadrature receiver channels. For example, a merge filter can be used to merge inputs having about the same group delay by configuring the merge filter to have a cutoff frequency selected based on the input channels' noise profiles. Additionally, merge filters can be cascaded and/or configured to include additional channel inputs to increase a number of quadrature receiver channels that can be combined.

Additional details of the reconstruction filter 150 of FIG. 5A can be similar to those described earlier.

Figure 5B:
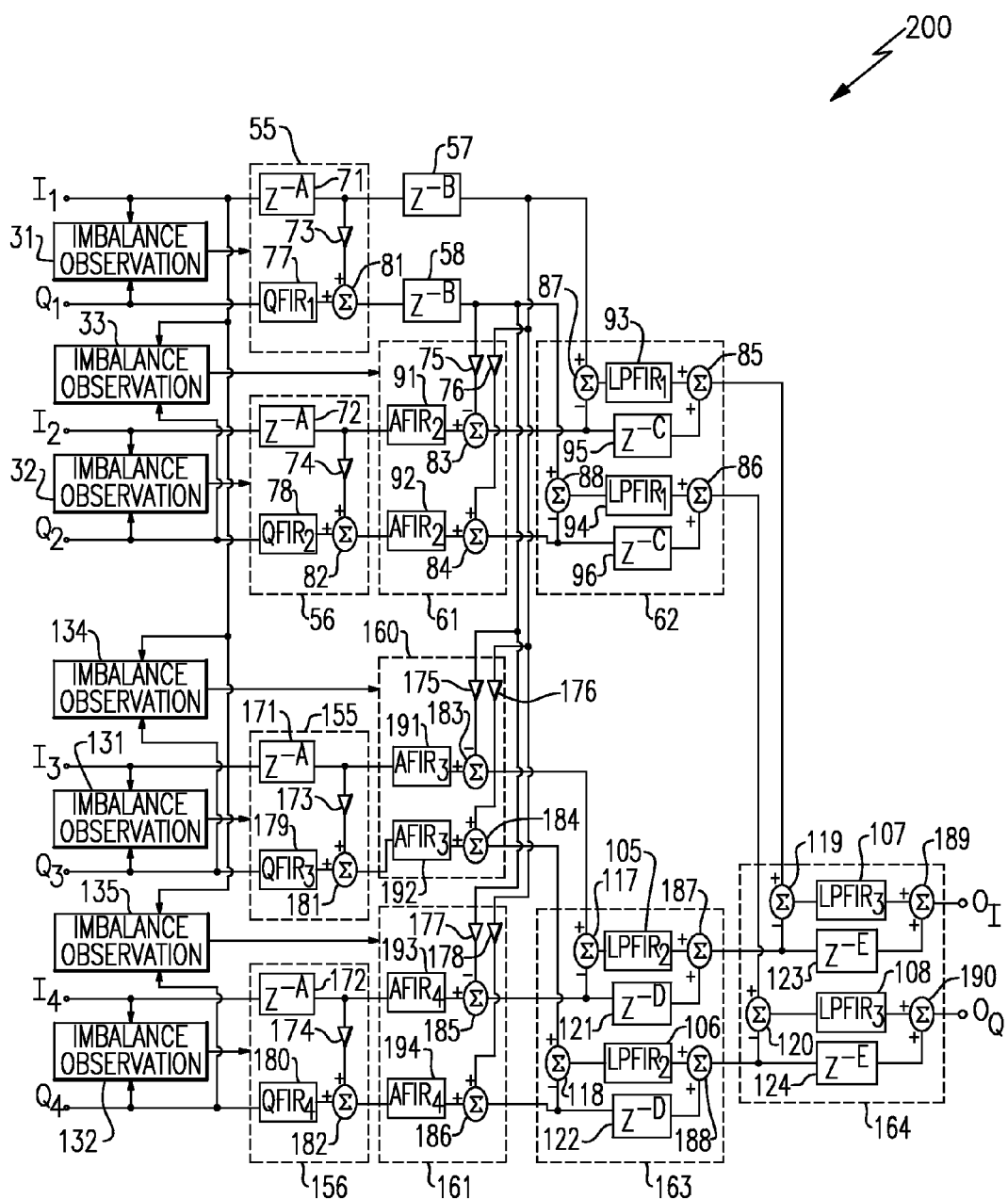
FIG. 5B is a schematic block diagram of one implementation of the reconstruction filter of FIG. 5A.

FIG. 5B is a schematic block diagram of one implementation of the reconstruction filter of FIG. 5A. The reconstruction filter 200 includes the first channel imbalance observation block 31, the second channel imbalance observation block 32, the third channel imbalance observation block 131, the fourth channel imbalance observation block 132, the first channel-to-channel imbalance observation block 33, the second channel-to-channel imbalance observation block 134, the third channel-to-channel imbalance observation block 135, the first QE correction block 55, the second QE correction block 56, the first delay block 57, the second delay block 58, the first alignment filter 61, and the first merge filter 62, which can be as described earlier. The reconstruction filter 200 further includes a third QE correction block 155, a fourth QE correction block 156, a second alignment filter 160, a third alignment filter 161, a second merge filter 163, and a third merge filter 164.

The third QE correction block 155 includes a third QFIR 179, a third QE correction adder 181, a seventh delay block 171, and a fifth variable gain block 173. The fourth QE correction block 156 includes a fourth QFIR 180, a fourth QE correction adder 182, an eighth delay block 172, and a sixth variable gain block 174. The third and fourth QE correction blocks 155, 156 can operate in a manner similar to that described earlier with respect to the first and second QE correction blocks 55, 56. The second alignment filter 160 includes third and fourth AFIRs 191, 192, a second alignment filter subtractor 183, a second alignment filter adder 184, and seventh and eighth variable gain blocks 175, 176. The third alignment filter 161 includes fifth and sixth AFIRs 193, 194, a third alignment filter subtractor 185, a third alignment filter adder 186, and ninth and tenth variable gain blocks 177, 178. The third and fourth alignment filters 160, 161 can operate in a manner similar to that described earlier with respect to the first alignment filter 61. The second merge filter 163 includes third and fourth LPFIR filters 105, 106, third and fourth merge filter subtractors 117, 118, ninth and tenth delay blocks 121, 122, and third and fourth merge filter adders 187, 188. The third merge filter 164 includes fifth and sixth LPFIR filters 107, 108, fifth and sixth merge filter subtractors 119, 120, eleventh and twelfth delay blocks 123, 124, and fifth and sixth merge filter adders 189, 190.

The second and third merge filters 163, 164 can operate in a manner similar to that described earlier with respect to the first merge filter 62.

Additional details of the reconstruction filter 200 can be similar to those described earlier.

Overview of One Application of a Reconstruction Filter to Digital Predistortion

As described above, reconstruction filters can be used to provide wide bandwidth analog-to-digital conversion of quadrature receive signals in transceiver systems. One example application of a reconstruction filter to provide enhanced bandwidth for digital predistortion observations will now be described. Although a reconstruction filter is described below in the context of digital predistortion, the reconstruction filters described herein can be used in other systems and/or applications.

Figure 6:
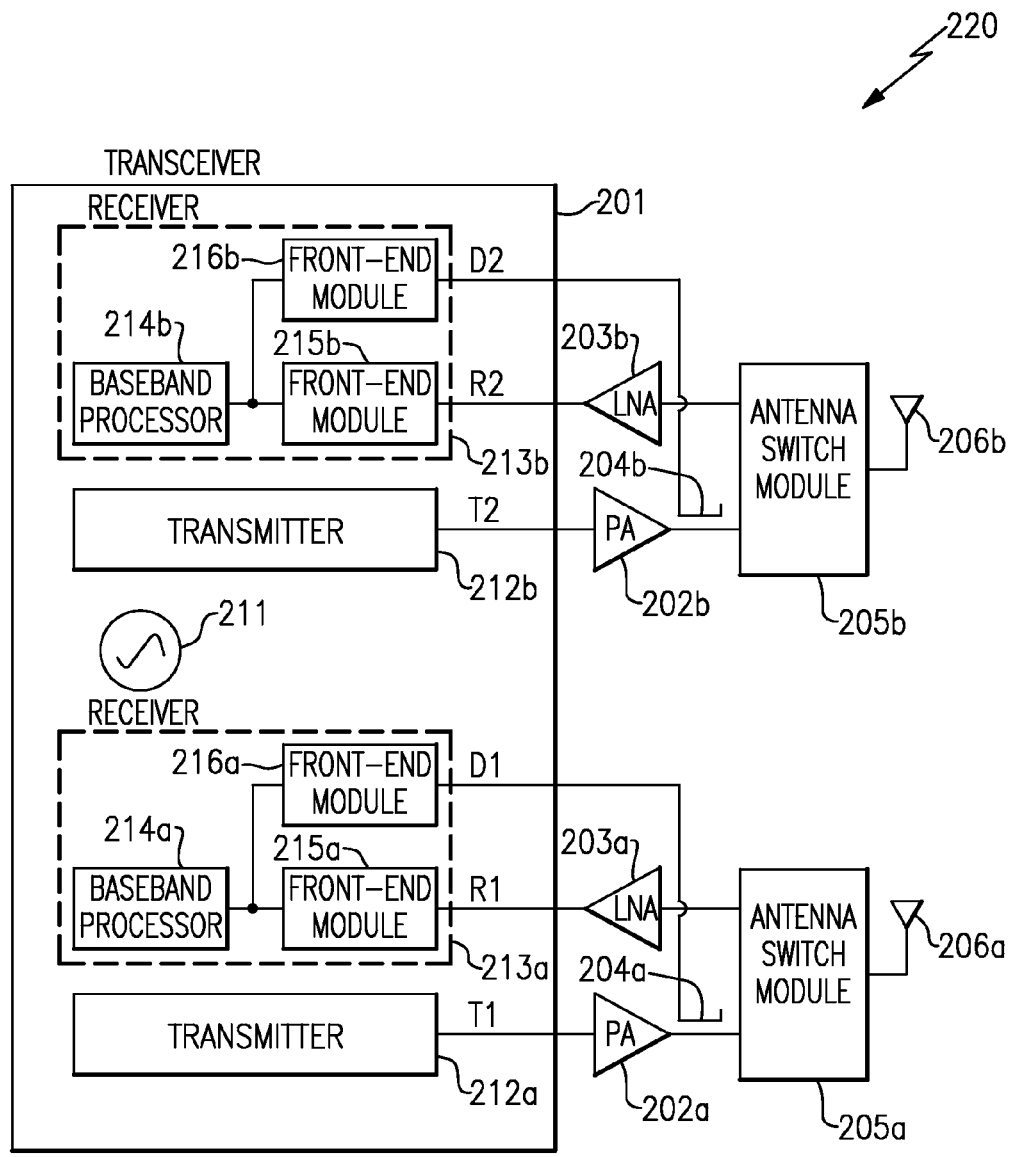
FIG. 6 is a schematic block diagram of one example of a radio frequency communication system.

FIG. 6 is a schematic block diagram of one example of a radio frequency communication system 220. The radio frequency communication system 220 includes a transceiver system 201, a first power amplifier (PA) 202a, a second PA 202b, a first low noise amplifier (LNA) 203a, a second LNA 203b, a first directional coupler 204a, a second directional coupler 204b, a first antenna switch module 205a, a second antenna switch module 205b, a first antenna 206a, and a second antenna 206b.

Although the radio frequency communication system 220 is illustrated as including two receive paths, two transmit paths, and two antennas, the teachings herein are also applicable to configurations using more or fewer receive paths, more or fewer transmit paths, and/or more or fewer antennas.

The transceiver system 201 includes an oscillator 211, a first transmitter 212a, a second transmitter 212b, a first receiver 213a, and a second receiver 213b. The first receiver 213a includes a first baseband processor 214a, a first receive front-end module (FEM) 215a, and a first observation FEM 216a. The second receiver 213b includes a second baseband processor 214b, a second receive FEM 215b, and a second observation FEM 216b.

The first LNA 203a and the first PA 202a are electrically coupled to the first antenna 206a through the first antenna switch module 205a. Additionally, the second LNA 203b and the second PA 202b are electrically coupled to the second antenna 206b through the second antenna switch module 205b. The first transmitter 212a generates a first transmit signal T1, which is provided to the first PA 202a for amplification. The second transmitter 212b generates a second transmit signal T2, which is provided to the second PA 202b for amplification. The first LNA 203a generates a first receive signal R1, which is provided to the first receive FEM 215a. Additionally, the second LNA 203b generates a second receive signal R2, which is provided to the second receive FEM 215b. The first directional coupler 204a generates a first directional coupler signal D1 by sensing an output power of the first PA 202a, and provides the first directional coupler signal D1 to the first observation FEM 216a. The second directional coupler 204b generates a second directional coupler signal D2 by sensing an output power of the second PA 202b, and provides the second directional coupler signal D2 to the second observation FEM 216b. As shown in FIG. 6, the first receive FEM 215a and the first observation FEM 216a are electrically coupled to the first baseband processor 214a, and the second receive FEM 215b and the second observation FEM 216b are electrically coupled to the second baseband processor 214b. The oscillator 211 can be used by all or part of the first and second receivers 213a, 213b and/or first and second transmitters 212a, 212b, including, for example, to generate quadrature clock signals for modulation and/or demodulation.

Certain communications systems can communicate using base stations with multiple antennas. For example, a base station can include 2 antennas, 4 antennas, 8 antennas, or another number of antennas. In certain configurations, a multi-antenna system can include a transceiver system having multiple transmit and receive paths. For example, in the illustrated configuration, the transceiver system 201 includes two transceivers associated with two transmit paths and two receive paths. However, other configurations are possible.

The first and second PAs 202a, 202b can amplify signals having a relatively high power. To aid in linearizing the first and second PAs 202a, 202b for different input power levels, digital predistortion (DPD) can be used. For example, DPD can refer to processing of a signal in the digital domain before signal is converted to analog, upconverted to radio frequency, and amplified by a PA. DPD can be used to compensate for nonlinear effects of the PA, including, for example, signal constellation distortion and/or signal spectrum spreading. DPD can not only improve the linearity of the PA, but can also reduce power dissipation and/or enhance transmit spectral purity.

To aid in determining or calculating an amount of DPD of the first and second PAs 202a, 202b, the illustrated transceiver system 201 includes the first and second directional couplers 204a, 204b for sensing output signals and/or transmit power levels of the first and second PAs 202a, 202b, respectively. In the illustrated configuration, the first and second directional coupler signals D1, D2, are provided to the first and second baseband processors 214a, 214b through the first and second observation FEMs 216a, 216b, respectively, for processing. In certain configurations, such as time division duplexing (TDD) implementations, the DPD feedback can be processed by a receiver's processor, since the receive path may be unused during transmission time slots associated with DPD observations. Although the teachings herein can be applied to TDD systems, the teachings herein are also applicable to frequency division duplexing (FDD) systems.

Figure 7:
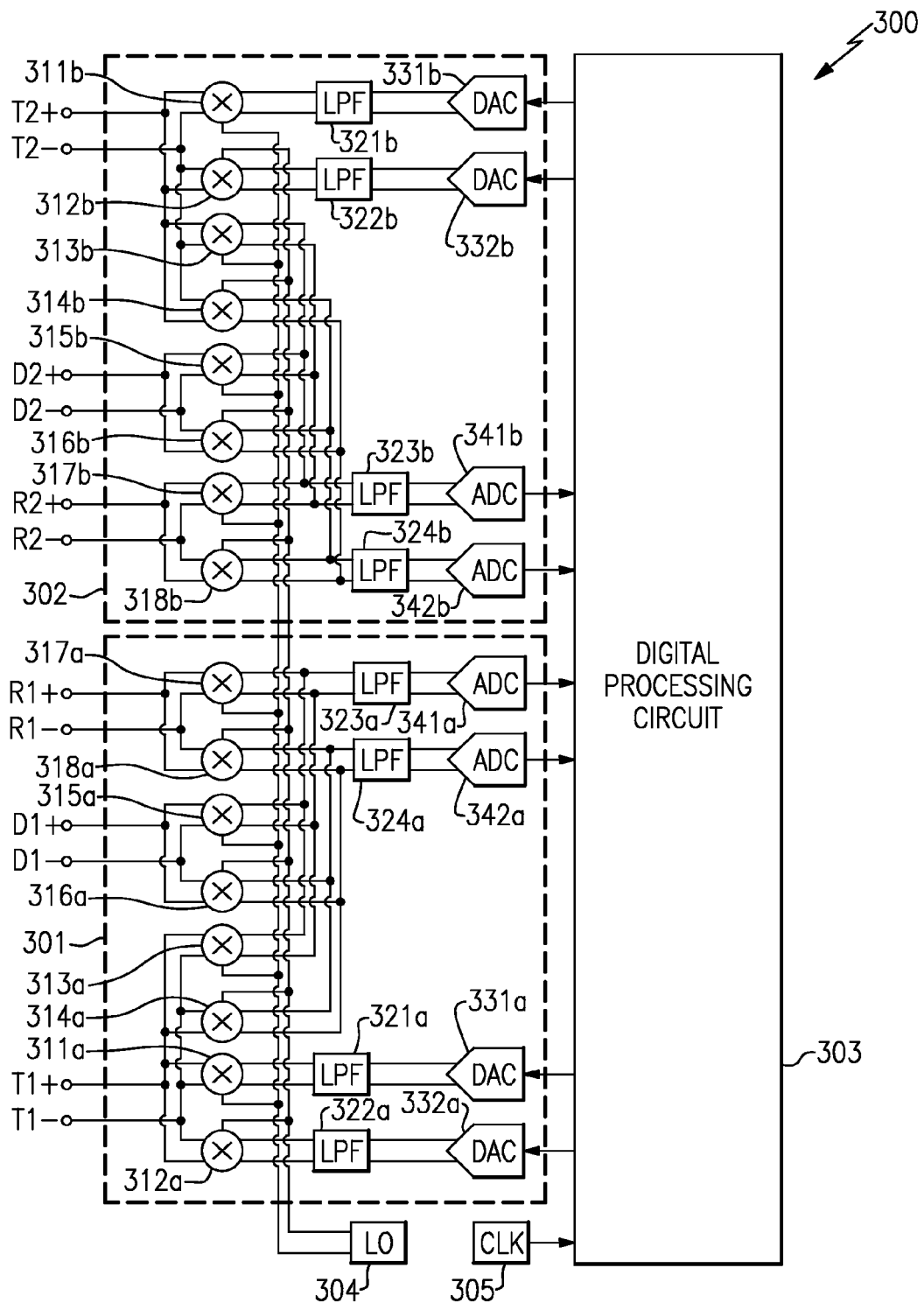
FIG. 7 is a schematic block diagram of one example of a transceiver system.

FIG. 7 is a schematic block diagram of one example of a transceiver system 300. The transceiver system 300 includes a first transceiver 301, a second transceiver 302, a digital processing circuit 303, a local oscillator 304, and a clock signal generator 305.

The first transceiver 301 includes a first pair of digital-to-analog converters (DACs) 331a, 332a, a first pair of analog-to-digital converters (ADCs) 341a, 342a, a first pair of transmit low pass filters 321a, 322a, a first pair of receive low pass filters 323a, 324a, a first pair of transmit path mixers 311a, 312a, a first pair of local feedback path mixers 313a, 314a, a first pair of DPD observation path mixers 315a, 316a, and a first pair of receive path mixers 317a, 318a.

The first transceiver 301 provides digital I and Q receive signals to the digital processing circuit 303 from the first pair of ADCs 341a, 342a, and the digital processing circuit 303 provides digital I and Q transmit signals to the first pair of DACs 331a, 332a. The first pair of DACs 331a, 332a generate differential I and Q signals, which are provided to the first pair of transmit low pass filters 321a, 322a. The first pair of transmit low pass filters 321a, 322a filter the differential I and Q signals to generate filtered differential I and Q signals. The first pair of transmit path mixers 311a, 312a receive the filtered differential I and Q signals and quadrature clock signals from the local oscillator 304, and generate a first differential transmit signal T1+, T1−. The first pair of receive path mixers 317a, 318a receive a first differential receive signal R1+, R1−, which the first pair of receive path mixers 317a, 318a can demodulate to provide differential I and Q demodulated signals to the first pair of receive low pass filters 323a, 324a. The first pair of receive low pass filters 323a, 324a can be used to generate filtered differential I and Q receive signals, which are provided to the first pair of ADCs 341a, 342a. The first pair of ADCs 341a, 342a can generate digital I and Q receive signals for the digital processing circuit 303. In certain configurations, the digital processing circuit 303 can include one or more baseband processors used to process the digital I and Q receive signals. As shown in FIG. 7, the first pair of local feedback path mixers 313a, 314a can be used to demodulate the first differential transmit signal T+, T− to generate differential I and Q local feedback signals, which can be provided to the digital processing circuit 303 through the first pair of receive low pass filters 323a, 324a and the first pair of ADCs 341a, 342a. Additionally, the first pair of DPD observation path mixers 315a, 316a can be used to demodulate a first differential directional coupler signal D1+, D1− to generate differential I and Q DPD observation signals, which can be provided to the digital processing circuit 303 through the first pair of receive low pass filters 323a, 324a and the first pair of ADCs 341a, 342a.

The second transceiver 302 includes a second pair of digital-to-analog converters 331b, 332b, a second pair of analog-to-digital converters 341b, 342b, a second pair of transmit low pass filters 321b, 322b, a second pair of receive low pass filters 323b, 324b, a second pair of transmit path mixers 311b, 312b, a second pair of local feedback path mixers 313b, 314b, a second pair of DPD observation path mixers 315b, 316b, and a second pair of receive path mixers 317b, 318b. The second transceiver 302 receives I and Q digital transmit signals from the digital processing circuit 303, and generates I and Q receive signals for the digital processing circuit 303. Additionally, the second transceiver 302 receives a second differential receive signal R2+, R2− and a second differential direction coupler signal D2+, D2−, and generates a second differential transmit signal T2+, T2−. Additional details of the second transceiver 302 can be similar to those of the first transceiver 301.

The transceiver system 300 of FIG. 7 illustrates one example implementation of the transceiver system 201 of FIG. 6. However, other configurations are possible.

Figure 8:
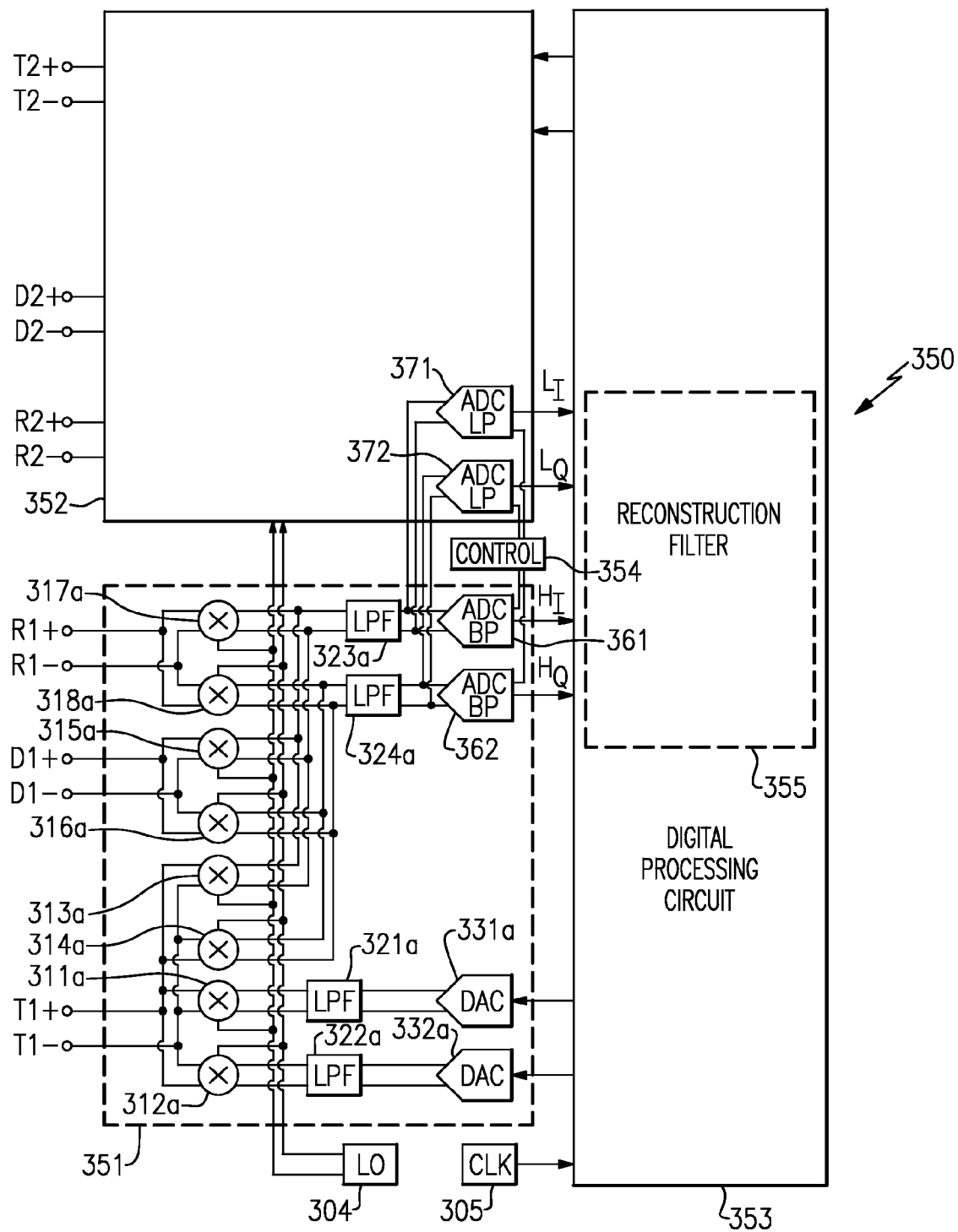
FIG. 8 is a schematic block diagram of a transceiver system according to one embodiment.

FIG. 8 is a schematic block diagram of a transceiver system 350 according to one embodiment. The transceiver system 350 includes a first transceiver 351, a second transceiver 352, a local oscillator 304, a clock signal generator 305, a digital processing circuit 353, and a control circuit 354.

The first transceiver 351 of FIG. 8 is similar to the first transceiver 301 of FIG. 7, except that the first transceiver 351 of FIG. 8 illustrates a configuration in which the first pair of ADCs 341a, 342a of FIG. 7 have been configured as a pair of band pass ADCs 361, 362. Additionally, the second transceiver 352 of FIG. 8 is similar to the second transceiver 302 of FIG. 7, except that the second transceiver 352 of FIG. 8 illustrates a configuration in which the second pair of ADCs 341b, 342b of FIG. 7 have been implemented as a pair of low pass ADCs 371, 372. Certain components of the second transceiver 352 of FIG. 8, such as mixers, low pass filters, and DACs, have been omitted from FIG. 8 for clarity, since such components need not be operational over a window of time associated with the DPD observation described below.

The illustrated transceiver system 350 can be used to compute digital predistortion (DPD) of a transmit path with enhanced bandwidth by advantageously using pairs of ADCs associated with different receive paths to collectively perform enhanced bandwidth DPD observations of a particular transmit path.

For example, the illustrated control circuit 354 has been used to digitally configure the ADCs 361, 362 of the first transceiver 351 in a band pass configuration, and to digitally configure the ADCs 371, 372 of the second transceiver 352 in a low pass configuration. The pair of band pass ADCs 361, 362 can generate I and Q high frequency compensated receive signals $H_I$, $H_Q$, and the pair of low pass ADCs 371, 372 can generate I and Q low frequency compensated receive signals $L_I$, $L_Q$. The illustrated digital processing circuit 353 includes a reconstruction filter 355, which can be used to combine the I and Q high frequency compensated receive signals $H_I$, $H_Q$, and the I and Q low frequency compensated receive signals $L_I$, $L_Q$ to generate I and Q output signals associated with a DPD observation having higher bandwidth and reduced overall noise.

Accordingly, the illustrated transceiver system 350 uses ADCs associated with multiple receive paths and a reconstruction filter to perform enhanced bandwidth DPD observations of a transmit path.

In the illustrated configuration, the pair of band pass ADCs 361, 362 can have a band pass noise profile, such as the band pass noise profile 22 shown in FIG. 2. Additionally, the pair of low pass ADCs 371, 372 can have a low pass noise profile, such as the low pass noise profile 21 shown in FIG. 2. Although FIG. 8 illustrates a configuration in which a reconstruction filter merges I and Q signals generated by low pass ADCs and band pass ADCs, the teachings herein are also applicable to other configurations, such as implementations in which I and Q signals of three or more pairs of ADCs with different noise profiles are merged or combined.

The illustrated configuration uses ADCs of multiple receive paths when performing DPD observations on a transmit path. For example, as shown in FIG. 8, the first pair of ADCs 361, 362 of the first transceiver 351 and the second pair of ADCs 371, 372 of the second transceiver 352 have been configured to provide analog-to-digital conversion of the same I and Q receive signals. However, the control circuit 354 has configured the first pair of ADCs 361, 362 of the first transceiver 351 in a band pass configuration, and has configured the second pair of ADCs 371, 372 of the second transceiver 352 in a low pass configuration.

Since only one transmit path is typically observed at a time due to limitations in the speed of digital processing circuitry, a multi-transceiver system may have ADCs associated with other transceivers that are non-operational when calculating DPD of a particular transmit path. In the illustrated configuration, a pair of ADCs associated with an unused transceiver is advantageously used to provide enhanced bandwidth DPD observations. However, when the transceiver system 350 of FIG. 8 transitions from a DPD observation mode to a normal receive mode, the control circuit 354 can be used to reconfigure the pairs of ADCs of the first and second transceivers 351, 352 to have similar noise profiles suitable for use for processing receive path signals. For example, the transceiver system 350 of FIG. 8 can be configured to operate substantially the same as the transceiver system 300 of FIG. 7 during a normal receive mode.

In one embodiment, the ADCs 361, 362 of the first transceiver 351 and the ADCs 371, 372 of the second transceiver 352 can be implemented as sigma delta converters, which can have noise profiles that can be digitally configured by the control circuit 354. For example, noise shaping can be used to provide a sigma delta converter with low noise over a selectable bandwidth. In certain configurations, during DPD observations, the control circuit 354 can digitally configure the ADCs 361, 362 to have low noise at high frequencies and can digitally configure the ADCs 371, 372 to have low noise at low frequencies. However, after DPD observations are complete, the control circuit 354 can digitally configure the ADCs 361, 362 of the first transceiver 351 and the ADCs 371, 372 of the second transceiver 352 to have a similar noise profile suitable for converting receive signals during a normal receive mode of the transceiver system 350.

Certain transceiver systems include ADCs implemented using sigma delta converters since such ADCs can use anti-aliasing, which can relax baseband and/or RF filtering requirements. However, sigma delta converters can have a limited bandwidth relative to other ADCs, since sigma delta converters can use a relatively high amount of oversampling to achieve a suitable signal-to-noise ratio (SNR). Although a sigma delta converter's bandwidth can be increased by increasing the converter's order and/or sampling rate, increasing bandwidth in this manner can undesirably increase power dissipation and/or cost, and may provide increased bandwidth that may not be needed in a normal receive operating mode.

The illustrated configuration can be used to overcome such limitations by providing wide bandwidth DPD observation by configuring ADCs of different receiver channels with different noise profiles, and using a reconstruction filter to combine the outputs of the different receiver channels to provide a DPD observation with wider bandwidth and lower noise.

Although FIG. 8 illustrates one example of DPD observation scheme using a reconstruction filter, other configurations are possible. For instance, although FIG. 8 illustrates a configuration in which the receive signal is branched or split at the output of the first pair of receive low pass filters 323a, 324a, the teachings are also applicable to configurations in which the receive signal is branched at other positions along the DPD observation signal path.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks, including, for example base stations. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
  a plurality of quadrature receiver channels comprising:
    a first quadrature receiver channel configured to receive an analog receive signal, and comprising a first pair of analog-to-digital converters (ADCs) having a first noise profile versus frequency and configured to generate a first pair of digital quadrature signals;
    a second quadrature receiver channel configured to receive the analog receive signal, and comprising a second pair of ADCs having a second noise profile versus frequency that is different from the first noise profile and configured to generate a second pair of digital quadrature signals,
    wherein the first noise profile has lower noise than the second noise profile over a first frequency range, and the second noise profile has lower noise than the first noise profile over a second frequency range; and
  a reconstruction filter configured to combine at least the first pair of digital quadrature signals and the second pair of digital quadrature signals to generate a pair of output quadrature signals having lower noise over frequency relative to the first noise profile and the second noise profile alone.

2. The apparatus of claim 1, wherein the reconstruction filter comprises:
  a first quadrature error (QE) correction block configured to correct for an in-phase/quadrature-phase (IQ) imbalance of the first quadrature receiver channel; and
  a second QE correction block configured to correct for an IQ imbalance of the second quadrature receiver channel.

3. The apparatus of claim 2, further comprising:
  one or more imbalance observation blocks configured to determine at least one of a first channel imbalance of the first quadrature receiver channel, a second channel imbalance of the second quadrature receiver channel, or a channel-to-channel imbalance between the first and second quadrature receiver channels.

4. The apparatus of claim 3, further comprising:
  a processor configured to generate correction data based on at least one of the first channel imbalance, the second channel imbalance, or the channel-to-channel imbalance, wherein the processor is configured to control at least one of the first QE correction block, the second QE correction block, or an alignment filter based on the correction data.

5. The apparatus of claim 2, wherein the first pair of digital quadrature signals comprises a first digital I signal and a first digital Q signal and the second pair of digital quadrature signals comprises a second digital I signal and a second digital Q signal, wherein the first QE correction block is configured to generate a first corrected I signal and a first corrected Q signal by correcting a gain error and a phase error between the first digital I signal and the first digital Q signal, and wherein the second QE correction block is configured to generate a second corrected I signal and a second corrected Q signal by correcting a gain error and a phase error between the second digital I signal and the second digital Q signal.

6. The apparatus of claim 5, further comprising:
  a first imbalance observation block configured to generate a first imbalance observation signal based on comparing the first digital I signal to the first digital Q signal, wherein the first QE correction block is configured to correct for the IQ imbalance of the first quadrature receiver channel based on the first imbalance observation signal; and
  a second imbalance observation block configured to generate a second imbalance observation signal based on comparing the second digital I signal to the second digital Q signal, wherein the second QE correction block is configured to correct for the IQ imbalance of the second quadrature receiver channel based on the second imbalance observation signal.

7. The apparatus of claim 6, further comprising
  a third imbalance observation block configured to generate a channel-to-channel imbalance signal based on comparing at least one of (i) the first digital I signal to the second digital I signal, (ii) the first digital I signal to the second digital Q signal, (iii) the first digital Q signal to the second digital Q signal, (iv) the second digital Q signal to the first digital I signal, or (v) a complex signal represented by the first digital I signal and the first digital Q signal to a complex signal represented by the second digital I signal and the second digital Q signal; and
  an alignment filter configured to correct for the channel-to-channel imbalance between the first and second quadrature receiver channels based on the channel-to-channel imbalance signal.

8. The apparatus of claim 5, further comprising:
  a first imbalance observation block configured to generate a first phase observation signal and a first gain observation signal based on observations of the first digital I signal to the first digital Q signal;
  a first coefficient determination block configured to generate a first plurality of filter coefficients based on the first phase observation signal and the first gain observation signal, wherein the first QE correction block receives the first plurality of filter coefficients;
  a second imbalance observation block configured to generate a second phase observation signal and a second gain observation signal based on observations of the second digital I signal and the second digital Q signal; and
  a second coefficient determination block configured to generate a second plurality of filter coefficients based on the second phase observation signal and the second gain observation signal, wherein the second QE correction block receives the second plurality of filter coefficients.

9. The apparatus of claim 5, wherein the reconstruction filter further comprises:
  a first delay block configured to delay the first corrected I signal to generate a first aligned I signal;

a second delay block configured to delay the first corrected Q signal to generate a first aligned Q signal; and an alignment filter configured to correct for a channel-to-channel imbalance between the first and second quadrature receiver channels, wherein the alignment filter is configured to generate a second aligned I signal by aligning the second corrected I signal to the first aligned I signal based on a gain error and a phase error between the first quadrature receiver channel and the second quadrature receiver channel, and to generate a second aligned Q signal by aligning the second corrected Q signal to the first aligned Q signal based on the gain error and the phase error between the first quadrature receiver channel and the second quadrature receiver channel.

10. The apparatus of claim 9, wherein the pair of output quadrature signals comprises an output I signal and an output Q signal, wherein the reconstruction filter further comprises:
a merge filter configured to generate the output I signal by merging the first aligned I signal and the second aligned I signal, and to generate the output Q signal by merging the first aligned Q signal and the second aligned Q signal.

11. The apparatus of claim 10, wherein the merge filter comprises:
a first low pass filter configured to low pass filter the first aligned I signal to generate a low pass filtered I signal;
a first high pass filter configured to high pass filter the second aligned I signal to generate a high pass filtered I signal;
a second low pass filter configured to low pass filter the first aligned Q signal to generate a low pass filtered Q signal;
a second high pass filter configured to high pass filter the second aligned Q signal to generate a high pass filtered Q signal;
a first adder configured to add the low pass filtered I signal and the high pass filtered I signal to generate the output I signal; and
a second adder configured to add the low pass filtered Q signal and the high pass filtered Q signal to generate the output Q signal.

12. The apparatus of claim 10, wherein the merge filter comprises:
a first subtractor configured to subtract the second aligned I signal from the first aligned I signal to generate a first difference signal;
a second subtractor configured to subtract the second aligned Q signal from the first aligned Q signal to generate a second difference signal;
a third delay block configured to delay the second aligned I signal to generate an all pass filtered I signal;
a fourth delay block configured to delay the second aligned Q signal to generate an all pass filtered Q signal;
a first low pass filter configured to low pass filter the first difference signal to generate a low pass filtered I signal;
a second low pass filter configured to low pass filter the second difference signal to generate a low pass filtered Q signal;
a first adder configured to add the low pass filtered I signal and the all pass filtered I signal to generate the output I signal; and
a second adder configured to add the low pass filtered Q signal and the all pass filtered Q signal to generate the output Q signal.

13. The apparatus of claim 9, wherein the alignment filter comprises:
a first filter configured to filter the second corrected I signal to generate a filtered I signal;
a second filter configured to filter the second corrected Q signal to generate a filtered Q signal;
a first variable gain block configured to scale the first aligned Q signal to generate a scaled Q signal;
a second variable gain block configured to scale the first aligned I signal to generate a scaled I signal;
a subtractor configured to subtract the scaled Q signal from the filtered I signal to generate the second aligned I signal; and
an adder configured to add the filtered Q signal and the scaled I signal to generate the second aligned Q signal.

14. The apparatus of claim 9, wherein the alignment filter comprises:
a first filter configured to filter the second corrected I signal to generate a first filtered signal;
a second filter configured to filter the first corrected Q signal to generate a second filtered signal;
a third filter configured to filter the second corrected Q signal to generate a third filtered signal;
a fourth filter configured to filter the first corrected I signal to generate a fourth filtered signal;
a subtractor configured to subtract the second filtered signal from the first filtered signal to generate the second aligned I signal; and
an adder configured to add the third filtered signal and the fourth filtered signal to generate the second aligned Q signal.

15. The apparatus of claim 5,
wherein the first QE correction block comprises:
a first correction delay block configured to delay the first digital I signal to generate the first corrected I signal;
a first variable gain block configured to scale the first corrected I signal to generate a first scaled I signal;
a first filter configured to filter the first digital Q signal to generate a first filtered Q signal;
a first adder configured to add the first filtered Q signal and the first scaled I signal to generate the first corrected Q signal,
wherein the second QE correction block comprises:
a second correction delay block configured to delay the second digital I signal to generate the second corrected I signal;
a second variable gain block configured to scale the second corrected I signal to generate a second scaled I signal;
a second filter configured to filter the second digital Q signal to generate a second filtered Q signal;
a second adder configured to add the second filtered Q signal and the second scaled I signal to generate the second corrected Q signal.

16. The apparatus of claim 5,
wherein the first QE correction block comprises:
a first correction delay block configured to delay the first digital I signal to generate the first corrected I signal;
a first filter configured to filter the first digital Q signal to generate a first filtered signal;
a second filter configured to filter the first digital I signal to generate a second filtered signal;
a first adder configured to add the first filtered signal and the second filtered signal to generate the first corrected Q signal, wherein the second QE correction block comprises:
a second correction delay block configured to delay the second digital I signal to generate the second corrected I signal;
a third filter configured to filter the second digital Q signal to generate a third filtered signal;
a fourth filter configured to filter the second digital I signal to generate a fourth filtered signal; and
a second adder configured to add the third filtered signal and the fourth filtered signal to generate the second corrected Q signal.

17. The apparatus of claim 3, further comprising a multiplexor, wherein the one or more imbalance observation blocks comprises a multiplexed imbalance observation block electrically coupled to the multiplexor, wherein the multiplexed imbalance observation block is configured to determine the first channel imbalance during a first time slot, to determine the second channel imbalance during a second time slot, and to determine the channel-to-channel imbalance during a third time slot.

18. The apparatus of claim 1, wherein the plurality of quadrature receiver channels further comprises:
a third quadrature receiver channel configured to receive the analog receive signal, and comprising a third pair of ADCs having a third noise profile versus frequency and configured to generate a third pair of digital quadrature signals,
wherein the reconstruction filter is further configured to generate the pair of output quadrature signals based in part on the third pair of digital quadrature signals.

19. The apparatus of claim 1, further comprising:
a time-shared imbalance observation block configured to determine a first channel imbalance during a first time slot, to determine a second channel imbalance during a second time slot, and to determine a channel-to-channel imbalance during a third time slot.

20. The apparatus of claim 1, wherein the analog receive signal corresponds to a digital predistortion (DPD) observation signal.

21. The apparatus of claim 1, wherein the reconstruction filter is further configured to generate an output I signal of the pair of output quadrature signals based on combining a first digital I signal of the first pair of digital quadrature signals and a second digital I signal of the second pair of digital quadrature signals, and wherein the reconstruction filter is further configured to generate an output Q signal of the pair of output quadrature signals based on combining a first digital Q signal of the first pair of digital quadrature signals and a second digital Q signal of the second pair of digital quadrature signals.

22. An electronically-implemented method of analog-to-digital conversion of quadrature receive signals, the method comprising:
receiving an analog receive signal at a first quadrature receiver channel and at a second quadrature receiver channel;
generating a first pair digital quadrature signals using a first pair of analog-to-digital converters (ADCs) of the first quadrature receiver channel, the first pair of ADCs having a first noise profile versus frequency;
generating a second pair of digital quadrature signals using a second pair of ADCs of the second quadrature receiver channel, the second pair of ADCs having a second noise profile versus frequency that is different than the first noise profile, wherein the first noise profile has lower noise than the second noise profile over a first frequency range, and the second noise profile has lower noise than the first noise profile over a second frequency range; and
combining at least the first pair of digital quadrature signals and the second pair of digital quadrature signals to generate a pair of output quadrature signals having lower noise over frequency relative to the first noise profile and the second noise profile alone.

23. The method of claim 22, wherein receiving the analog receive signal comprises receiving a digital predistortion (DPD) observation signal, wherein the first pair of ADCs operate in a first transceiver, and wherein the second pair of ADCs operate in a second transceiver.

24. The method of claim 23, further comprising:
digitally configuring the first pair of ADCs of the first transceiver in a band pass mode using a control circuit; and
digitally configuring the second pair of ADCs of the second transceiver in a low pass mode using the control circuit.

25. The method of claim 22, further comprising:
correcting for an IQ imbalance of the first quadrature receiver channel using a first QE correction block of the reconstruction filter; and
correcting for an IQ imbalance of the second quadrature receiver channel using a second QE correction block of the reconstruction filter.

26. The method of claim 25, further comprising:
correcting for a channel-to-channel imbalance between the first and second quadrature receiver channels using an alignment filter.

27. The method of claim 19, wherein generating the first pair of digital quadrature signals comprising generating a first digital I signal and a first digital Q signal, wherein generating the second pair of digital quadrature signals comprises generating a second digital I signal and a second digital Q signal, and wherein combining at least the first pair of digital quadrature signals and the second pair of digital quadrature signals comprises combining the first digital I signal and the second digital I signal to generate an output I signal of the pair of output quadrature signals, and combining the first digital Q signal and the second digital Q signal to generate an output Q signal of the pair of output quadrature signals.

28. A transceiver system comprising:
a first quadrature receiver channel configured to receive an analog receive signal, and comprising a first pair of analog-to-digital converters (ADCs) having a first noise profile versus frequency and configured to generate a first pair of digital quadrature signals;
a second quadrature receiver channel configured to receive the analog receive signal, and comprising a second pair of ADCs having a second noise profile versus frequency that is different from the first noise profile and configured to generate a second pair of digital quadrature signals, wherein the first noise profile has lower noise than the second noise profile over a first frequency range, and the second noise profile has lower noise than the first noise profile over a second frequency range; and
a digital processing circuit comprising a reconstruction filter configured to generate a pair of output quadrature signals by combining at least the first pair of digital quadrature signals and the second pair of digital quadrature signals, wherein the reconstruction filter generates the pair of output quadrature signals to have lower noise over frequency relative to the first noise profile and the second noise profile alone.

29. The transceiver system of claim 25, wherein the reconstruction filter comprises:
a first QE correction block configured to correct for an IQ imbalance of the first quadrature receiver channel; and
a second QE correction block configured to correct for an IQ imbalance of the second quadrature receiver channel.

30. The transceiver system of claim 29, wherein the reconstruction filter further comprises an alignment filter configured to correct for an imbalance between the first and second quadrature receiver channels.

31. The transceiver system of claim 30, wherein the analog receive signal corresponds to a digital predistortion (DPD) observation signal, the transceiver system further comprising:
a first transceiver comprising the first quadrature receiver channel;
a second transceiver comprising the second quadrature receiver channel; and
a control circuit configured to digitally control the first noise profile and the second noise profile.

32. The transceiver system of claim 31, wherein the control circuit is configured to digitally control the first pair of ADCs in a band pass mode when the transceiver system operates in a DPD observation mode, and wherein the control circuit is further configured to digitally control the second pair of ADCs in a low pass mode when the transceiver system operates in the DPD observation mode.

33. The transceiver system of claim 28, further comprising:
a time-shared imbalance observation block configured to determine a first channel imbalance during a first time slot, to determine a second channel imbalance during a second time slot, and to determine a channel-to-channel imbalance during a third time slot.

34. The transceiver system of claim 28, wherein the analog receive signal corresponds to a digital predistortion (DPD) observation signal.

35. The transceiver system of claim 28, wherein the reconstruction filter is further configured to generate an output I signal of the pair of output quadrature signals based on combining a first digital I signal of the first pair of digital quadrature signals and a second digital I signal of the second pair of digital quadrature signals, and wherein the reconstruction filter is further configured to generate an output Q signal of the pair of output quadrature signals based on combining a first digital Q signal of the first pair of digital quadrature signals and a second digital Q signal of the second pair of digital quadrature signals.

* * * * *

UNITED STATES PATENT AND TRADEMARK OFFICE
CERTIFICATE OF CORRECTION

PATENT NO.         : 9,577,689 B2
APPLICATION NO.    : 14/183144
DATED              : February 21, 2017
INVENTOR(S)        : Montalvo et al.

It is certified that error appears in the above-identified patent and that said Letters Patent is hereby corrected as shown below:

In the Claims

In Column 33 at Line 58, in Claim 22, after "pair" insert --of--.

In Column 34 at Line 33, in Claim 27, change "claim 19," to --claim 22,--.

In Column 35 at Line 3, in Claim 29, change "claim 25," to --claim 28,--.

In Column 35 at Line 14 (approx.), in Claim 31, change "claim 30," to --claim 28,--.

Signed and Sealed this
Nineteenth Day of June, 2018

Andrei Iancu
*Director of the United States Patent and Trademark Office*